United States Patent
Eun

(10) Patent No.: US 9,559,147 B2
(45) Date of Patent: Jan. 31, 2017

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventor: Sung-Ho Eun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/083,639

(22) Filed: Mar. 29, 2016

(65) Prior Publication Data

US 2016/0358976 A1    Dec. 8, 2016

(30) Foreign Application Priority Data

Jun. 5, 2015  (KR) .................. 10-2015-0079606

(51) Int. Cl.

| | | |
|---|---|---|
| H01L 47/00 | (2006.01) | |
| H01L 27/24 | (2006.01) | |
| H01L 23/528 | (2006.01) | |
| H01L 45/00 | (2006.01) | |
| H01L 43/08 | (2006.01) | |
| H01L 43/02 | (2006.01) | |

(Continued)

(52) U.S. Cl.
CPC ......... *H01L 27/2463* (2013.01); *H01L 23/528* (2013.01); *H01L 27/222* (2013.01); *H01L 43/02* (2013.01); *H01L 43/08* (2013.01); *H01L 43/10* (2013.01); *H01L 45/06* (2013.01); *H01L 45/1233* (2013.01); *H01L 45/1253* (2013.01); *H01L 45/144* (2013.01)

(58) Field of Classification Search
CPC ............... H01L 27/2463; H01L 23/528; H01L 45/1233; H01L 45/1253
USPC .......................................................... 257/4
See application file for complete search history.

(56) References Cited

U.S. PATENT DOCUMENTS

| | | |
|---|---|---|
| 7,259,023 B2 | 8/2007 | Kuo et al. |
| 7,541,252 B2 | 6/2009 | Eun et al. |
| 8,101,938 B2 | 1/2012 | Lung |

(Continued)

FOREIGN PATENT DOCUMENTS

| | | |
|---|---|---|
| KR | 20100107673 A | 10/2010 |
| KR | 20120016839 A | 2/2012 |
| KR | 20130059088 A | 6/2013 |

*Primary Examiner* — David S Blum
(74) *Attorney, Agent, or Firm* — Harness, Dickey & Pierce, P.L.C.

(57) ABSTRACT

A semiconductor device includes first conductive lines and first and second insulation patterns on a substrate, first structures spaced apart from each other on the first conductive lines, a variable resistance pattern on the first structures, and a second electrode on the variable resistance pattern. The first conductive lines extend in a first direction. The first structures include a switching pattern and a first electrode sequentially stacked. The first insulation pattern fills a space between the first structures in a second direction and the first insulation pattern has a first top surface higher than a top surface of the first structures. The second insulation pattern fills a space between the first structures in the first direction, and the second insulation pattern has a second top surface higher than a top surface of the first structures. The variable resistance pattern fills an opening defined by the first and second insulation patterns.

20 Claims, 30 Drawing Sheets

(51) Int. Cl.
　　　*H01L 43/10*　　　(2006.01)
　　　*H01L 27/22*　　　(2006.01)

(56) References Cited

U.S. PATENT DOCUMENTS

| | | |
|---|---|---|
| 8,349,636 B2 | 1/2013 | Lee et al. |
| 8,455,298 B2 | 6/2013 | Apodaca et al. |
| 8,546,177 B2 | 10/2013 | Seo et al. |
| 8,680,500 B2 | 3/2014 | Oh et al. |
| 2008/0280390 A1 | 11/2008 | Kim et al. |
| 2014/0166964 A1 | 6/2014 | Lee |
| 2014/0269005 A1* | 9/2014 | Kang .................. H01L 45/1666 365/148 |
| 2014/0346425 A1 | 11/2014 | Liu et al. |

\* cited by examiner

SECOND      FIRST
DIRECTION   DIRECTION

SECOND        FIRST
DIRECTION   DIRECTION

SECOND        FIRST
DIRECTION   DIRECTION

SECOND       FIRST
DIRECTION   DIRECTION

SECOND          FIRST
DIRECTION    DIRECTION

SECOND DIRECTION    FIRST DIRECTION

SECOND　　FIRST
DIRECTION　DIRECTION

SEMICONDUCTOR DEVICES AND METHODS OF MANUFACTURING THE SAME

CROSS-REFERENCE TO RELATED APPLICATION

This application claims priority under 35 USC §119 to Korean Patent Application No. 10-2015-0079606, filed on Jun. 5, 2015 in the Korean Intellectual Property Office (KIPO), the contents of which are herein incorporated by reference in their entirety.

BACKGROUND

1. Field

Example embodiments relate to a semiconductor device and/or a method of manufacturing the same. More particularly, example embodiments relate to a variable resistance memory devices and/or methods of manufacturing the same.

2. Description of Related Art

As semiconductor devices are highly integrated, variable resistance memory devices having cross point array structures have been manufactured.

SUMMARY

Example embodiments relate to a semiconductor device including lower and upper patterns exactly aligned with each other.

Example embodiments relate to a method of manufacturing a semiconductor device including lower and upper patterns exactly aligned with each other.

According to example embodiments, a semiconductor device includes a substrate, a plurality of first conductive lines, a plurality of first structures, a first insulation pattern, a second insulation pattern, a variable resistance pattern, and a second electrode. The first conductive lines are on the substrate. The first conductive lines extend in a first direction. The first structures may be spaced apart from each other, and may be on the first conductive lines. The first structures include a switching pattern and a first electrode sequentially stacked. Top surfaces of the switching pattern and the first electrode are substantially coplanar with each other. The first insulation pattern is on the substrate. The first insulation pattern extends in the first direction between the first structures to fill a space between the first structures in a second direction that is substantially perpendicular to the first direction. The first insulation pattern has a first top surface that is higher than a top surface of the first structures. The second insulation pattern is on the substrate. The second insulation pattern extends in the second direction to fill a space between the first structures in the first direction. The second insulation pattern has a second top surface that is higher than a top surface of the first structures. The variable resistance pattern is on the first structure, and the variable resistance pattern fills an opening defined by the first and second insulation patterns. The second electrode is on the variable resistance pattern.

In example embodiments, the semiconductor device may further include a first spacer on upper sidewalls of the first insulation pattern above the first structure, and a second spacer on upper sidewalls of the second insulation pattern above the first structure.

In example embodiments, a bottom surface of the variable resistance pattern may be smaller than an area of the top surface of the first structures.

In example embodiments, the variable resistance pattern may be on a central upper surface of the first structure.

In example embodiments, a lower width of the variable resistance pattern may be less than an upper width of the variable resistance pattern.

In example embodiments, a top surface of the variable resistance pattern may be substantially coplanar with the first top surface of the first insulation pattern.

In example embodiments, the second electrode may extend in the second direction.

In example embodiments, the second top surface may be higher than the first top surface, and the second electrode may be between protruding portions of the second insulation patterns above the first insulation pattern.

In example embodiments, a top surface of the second electrode may be substantially coplanar with a top surface of the second insulation pattern or the top surface of the second electrode may be lower than the top surface of the second insulation pattern.

In example embodiments, the first and second insulation patterns may include substantially a same material.

In example embodiments, a second conductive pattern may be further formed on the second electrode, and the second conductive pattern may have a resistance lower than a resistance of the second electrode, and the second conductive pattern may extend in the second direction.

In example embodiments, a top surface of the second conductive pattern may be higher than the second top surface of the second insulation pattern.

In example embodiments, a top surface of the second electrode may be substantially coplanar with a top surface of the second insulation pattern or the top surface of the second electrode may be lower than the top surface of the second insulation pattern.

In example embodiments, the variable resistance pattern may include a chalcogenide-based material.

In example embodiments, the second electrode may have a pillar shape.

In example embodiments, the first and second top surfaces may be substantially coplanar with each other, and the second electrode may be on the variable resistance pattern in the opening defined by the first and second insulation patterns.

In example embodiments, a top surface of the second electrode may be substantially coplanar with a top surface of the second insulation pattern or the top surface of the second electrode may be lower than the top surface of the second insulation pattern.

In example embodiments, an upper width in the second direction of the first conductive line may be substantially the same as a lower width in the second direction of the first structure.

According to example embodiments, a semiconductor device includes a substrate, a plurality of first conductive lines, a plurality of first structures, a first insulation pattern, a second insulation pattern, a first spacer, a second spacer, a variable resistance pattern, and a second electrode. The first conductive lines are on the substrate and the first conductive lines extend in a first direction. The first structures may be spaced apart from each other and on the first conductive lines. The first structures include a switching pattern and a first electrode sequentially stacked. Top surfaces of the switching pattern and the first electrode are substantially coplanar with each other. The first insulation pattern is on the substrate. The first insulation pattern extends in the first direction to fill a space between the first structures in a second direction substantially perpendicular to the first direction, and the first insulation pattern has a first top surface that is higher than a top surface of the first structures. The second insulation pattern is on the substrate and extends in the second direction to fill a space between the first structures in the first direction. The second insulation pattern has a second top surface that is higher than a top surface of the first structures. The first spacer is on upper sidewalls of the first insulation pattern above the first structures. The second spacer is on upper sidewalls of the second insulation pattern above the first structures. The variable resistance pattern is on the first structures, and the variable resistance pattern fills an opening defined by the first and second insulation patterns. The second electrode is on the variable resistance pattern.

In example embodiments, the second electrode may extend in the second direction.

In example embodiments, the second electrode may have a pillar shape.

In example embodiments, the variable resistance pattern may include a chalcogenide-based material.

According to example embodiments, a method of manufacturing a semiconductor device includes forming a preliminary first structure on a substrate and the preliminary first structure includes a first conductive line, a preliminary switching pattern, a preliminary first electrode and a preliminary first hard mask extending in a first directions. First structures and a first hard mask are formed on the first conductive line. The forming the first structure and the first hard mask on the first conductive line includes etching portions of the preliminary first electrode, the preliminary switching pattern and the preliminary first hard mask in a second direction substantially perpendicular to the first direction. The first structures include a first electrode and a switching pattern sequentially stacked. A first insulation pattern and a second insulation pattern are formed on the substrate. The first insulation pattern extends in the first direction to fill a space between the first structures in the second direction. The first insulation pattern fills a spacer between the first structures in the second direction and has a first top surface higher than a top surface of the first structure, and the second insulation pattern fills a spacer between the first structures in the first direction and has a second top surface higher than a top surface of the first structure. Variable resistance patterns are formed on the first structures to fill openings defined by the first and second insulation patterns. A second electrode is formed on the variable resistance patterns.

In example embodiments, the forming the preliminary first structure on the substrate may include: forming a first conductive layer, a preliminary switching layer, and a first electrode on the substrate; forming a preliminary first hard mask extending in the first direction on the first electrode layer; and etching the first conductive layer, the preliminary switching layer and the first electrode layer using the preliminary first hard mask as an etching mask.

In example embodiments, the forming the preliminary first structure may include forming a plurality of preliminary first structures. After forming the preliminary first structures, a first sacrificial layer may be formed on the substrate to fill a space between the preliminary first structures, and a second hard mask extending in the second direction may be formed on the preliminary first hard mask and the first sacrificial layer.

In example embodiments, when the first structure and the first hard mask are formed on the first conductive line, the preliminary hard mask and the first sacrificial layer may be etched using the second hard mask as an etching mask.

In example embodiments, when the first and second insulation patterns are formed on substrate, the first sacrificial layer may be removed. An insulation material may fill the space between the first structure to form the first and second insulation patterns on the substrate. The first and second hard masks may be removed.

In example embodiments, before forming the variable resistance pattern, a first spacer may be further formed on upper sidewalls of the first insulation pattern above the first structure. A second spacer may be formed on upper sidewalls of the second insulation pattern above the first structure.

In example embodiments, the first top surface may be higher than the second top surface. A first opening over the first structure may be defined by the first and second insulation patterns. A second opening that extends in the second direction over the first opening may be defined by the second insulation pattern.

In example embodiments, the forming the variable resistance pattern may include forming a variable resistance layer to partially fill the first and second openings, and etching back the variable resistance layer to expose top surfaces of the first and second insulation patterns to form the variable resistance pattern in the first opening.

In example embodiments, the forming the second electrode may include forming a second electrode layer on the variable resistance pattern to fill the second opening, and planarizing the second electrode layer until a top surface of the second insulation pattern may be exposed to form the second electrode.

In example embodiments, the first top surface may be substantially coplanar with the second top surface, so that the first and second openings defined by the first and second insulation patterns may be formed on the first structure.

In example embodiments, when the variable resistance pattern is formed on the first structure, a variable resistance layer may partially fill the openings. The variable resistance layer may be etched back to form the variable resistance pattern filling a lower portion of each of the openings and may have a top surface lower than top surfaces of the first and second insulation patterns.

In example embodiments, when the second electrode is formed on the variable resistance pattern, a second electrode layer may be formed on the variable resistance pattern and the first and second insulation patterns. The second electrode layer may be planarized until a top surface of the second insulation pattern may be exposed to form the second electrode.

In example embodiments, a second conductive line may be formed on the second electrode. The second conductive line may have a resistance that is lower than a resistance of the second electrode and the second conductive line may extend in the second direction.

According to example embodiments, the first conductive line, the switching pattern, the first electrode may be formed by etching processes in embossed, respectively, and the variable resistance pattern and the second electrode may be formed to be self-aligned with the first electrode by an etching process in intaglio. Thus, a mis-alignment between upper and lower patterns may decrease. Thus, failures due to the mis-alignment may decrease, so that the semiconductor device may have good electrical characteristics.

According to example embodiments, a semiconductor device includes a substrate; first conductive lines on the substrate, the first conductive lines extending in a first direction and being spaced apart from each other in a second direction that intersects the first direction; first structures on the first conductive lines, the first structures being spaced apart from each other in the first direction on the first conductive lines; a variable resistance pattern on the first structures, the variable resistance pattern including variable resistance structures on the first structures, respectively; electrodes on the substrate over the variable resistance pattern, the electrodes being spaced apart from each other in the first direction and extending in the second direction, the electrodes crossing over the first conductive lines; a first insulation pattern on the substrate, the first insulation pattern extending between a bottom surface of the electrodes and a portion of the substrate exposed by the first conductive lines; and a second insulation pattern on the first conductive lines, the second insulation pattern extending in the second direction, the second insulation pattern extending between adjacent pairs of the first structures, between adjacent pairs of the variable resistance structures, and between adjacent pairs of the electrodes.

In example embodiments, the semiconductor device may further include first spacers on the first structures and second spacers on the first structures. The first structures may include a first electrode on a switching structure. The electrodes on the substrate over the variable resistance pattern may be second electrodes. There may be two of the first spacers spaced apart from each other in the second direction on each of the first structures. There may be two of the second spacers spaced apart from each other in the first direction on each of the first structures. The variable resistance structures on the first structures may be between the two of the first spacers and the two of the second spacers. A height of the second spacers may be greater than a height of the first spacers.

In example embodiments, an area of a bottom of the variable resistance structures may be less than an area of a top of the variable resistance structures.

In example embodiments, the first insulation pattern may extend between adjacent pairs of the first conductive lines, and a bottom surface of the first insulation pattern may be closer to the substrate than a bottom surface of the second insulation pattern.

In example embodiments, a top surface of the second insulation pattern may be level with a top surface of the electrodes.

BRIEF DESCRIPTION OF THE DRAWINGS

Example embodiments will be more clearly understood from the following detailed description of non-limiting embodiments taken in conjunction with the accompanying drawings. The drawings are not necessarily to scale, emphasis instead being placed upon illustrating principles of inventive concepts. In the drawings:

FIG. 19 is a perspective view illustrating a semiconductor device in accordance with example embodiments;

FIGS. 20 to 21 are cross-sectional views, taken along lines XX-XX' and XXI-XXI' of FIG. 19;

DESCRIPTION OF EXAMPLE EMBODIMENTS

Figure 1:
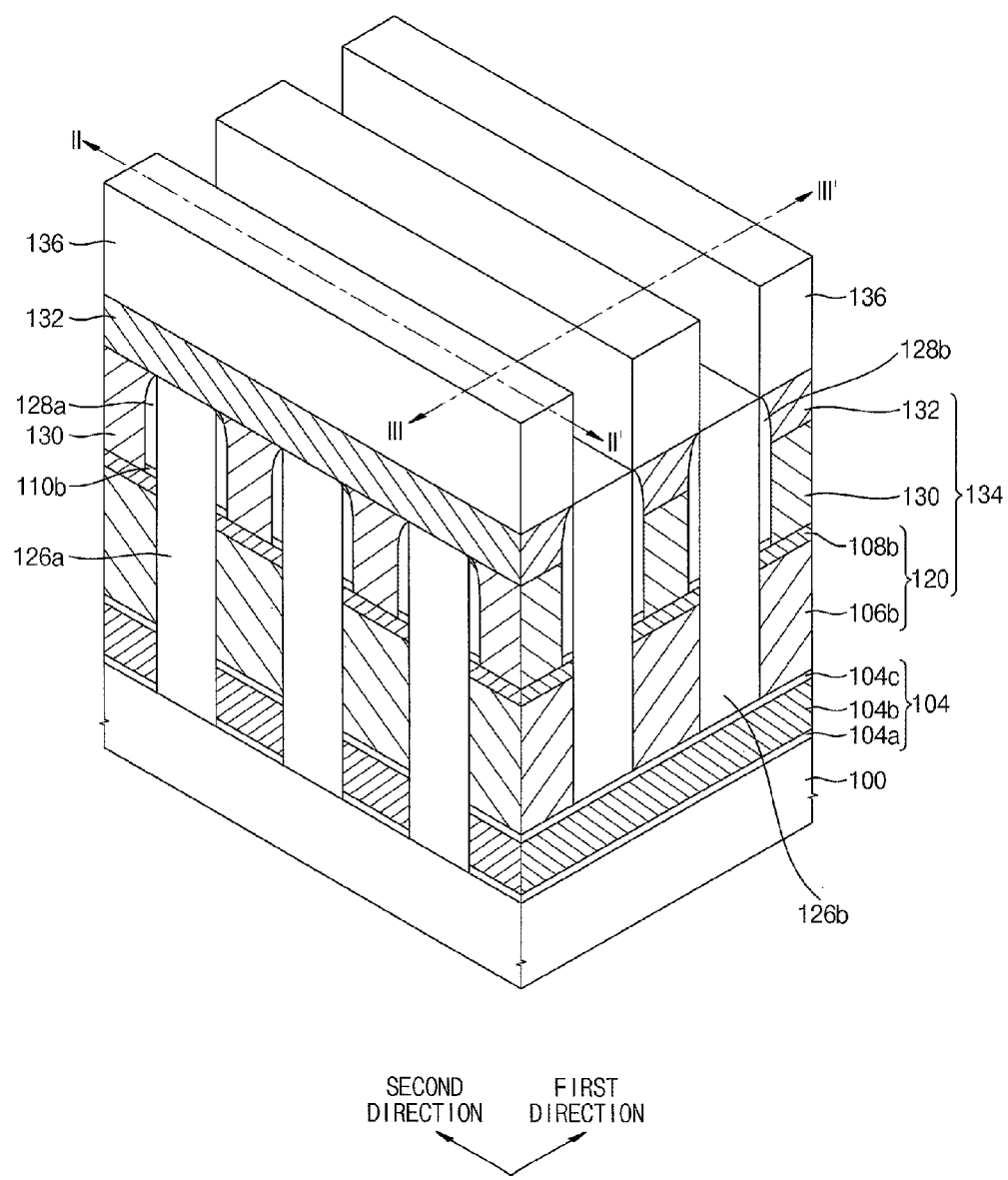
FIG. 1 is a perspective view illustrating a semiconductor device in accordance with example embodiments.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this description will be thorough and complete, and will fully convey the scope of inventive concepts to those skilled in the art. In the drawings, the sizes and relative sizes of layers and regions may be exaggerated for clarity. Like reference characters and/or numerals in the drawings denote like elements, and thus their description may not be repeated.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of inventive concepts.

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
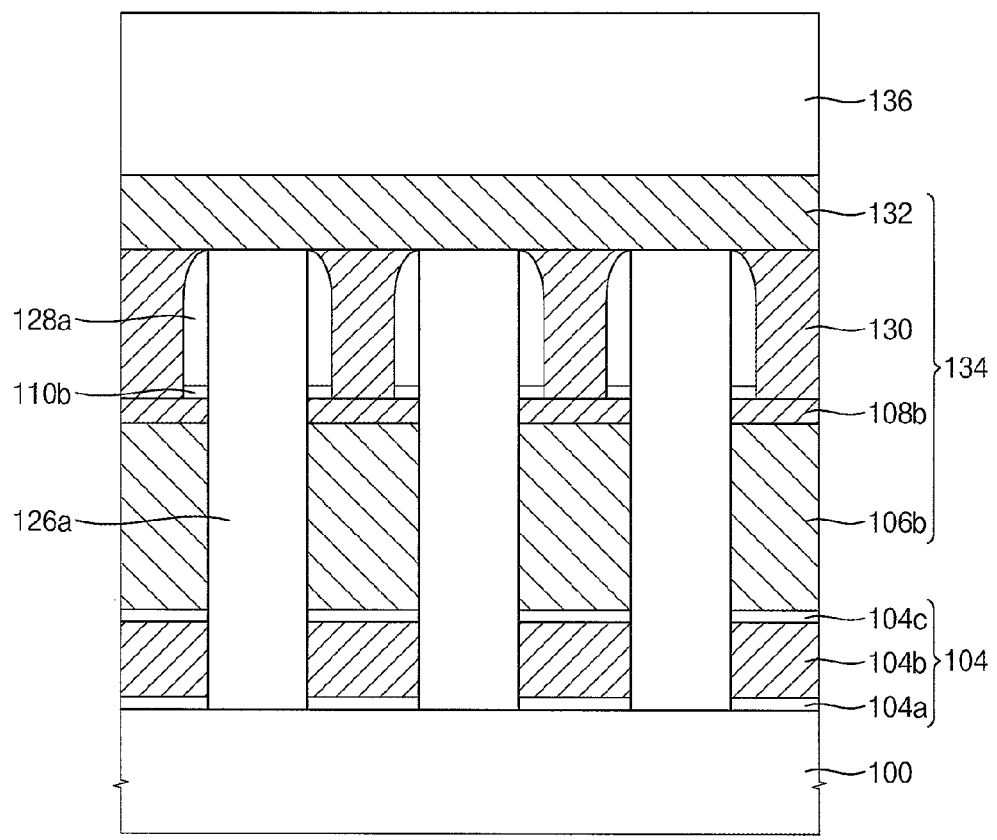
FIGS. 2 to 3 are cross-sectional views, taken along lines II-II' and III-III' of FIG. 1.
Figure 3:
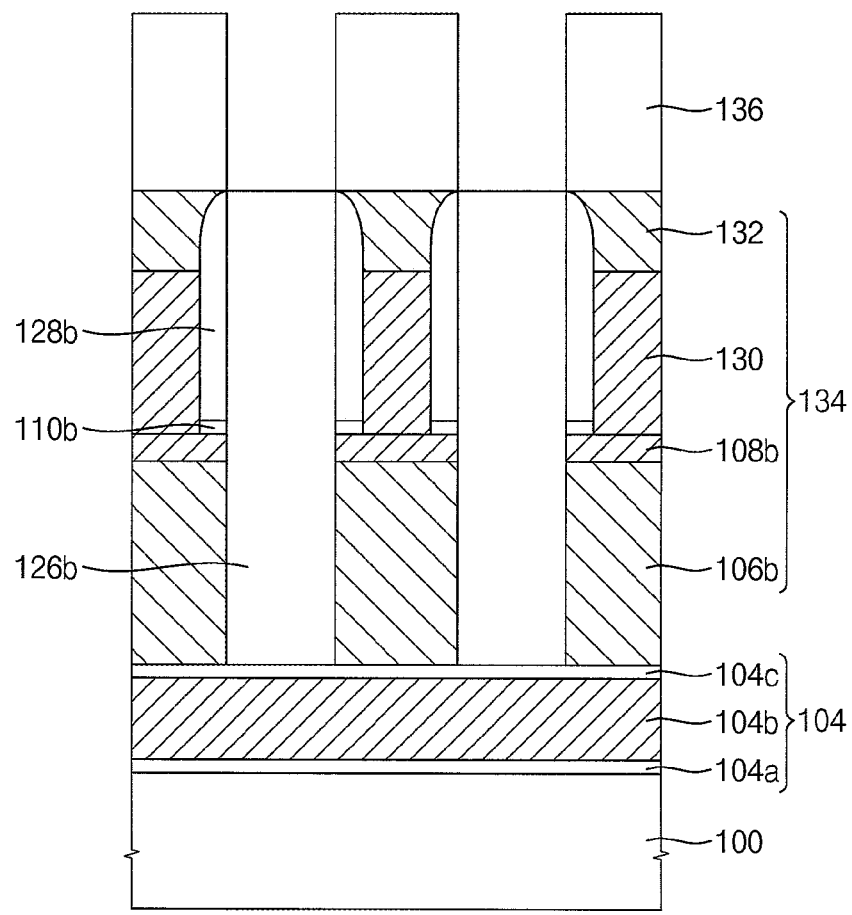

FIG. 1 is a perspective view illustrating a semiconductor device in accordance with example embodiments. FIGS. 2 to 3 are cross-sectional views, taken along lines II-II' and III-III' of FIG. 1. In example embodiments, the semiconductor device may include a variable resistance memory device.

A first direction and a second direction may be substantially parallel to a top surface of a substrate, and may be substantially perpendicular to each other. Also, a third direction may be substantially perpendicular to the top surface of the substrate. Hereinafter, the definitions of the first to third directions may be the same in all figures.

Referring to FIGS. 1 and 3, the semiconductor device may include a first conductive line 104, a first structure 120, a first insulation pattern 126a, a second insulation pattern 126b, a variable resistance pattern 130, and a second electrode 132 on a substrate 100. The first structure 120 may include a switching pattern 106b and a first electrode 108b. The semiconductor device may further include a second conductive line 136 on the second electrode 132.

The substrate 100 may include silicon, germanium, silicon-germanium, or III-V compounds, e.g., GaP, GaAs, GaSb, etc. In example embodiments, the substrate 100 may be a silicon-on-insulator (SOI) substrate, or a germanium-on-insulator (GOI) substrate.

The substrate 100 may include a trench (not shown) extending in the first direction, and isolation patterns (not shown) may fill the trench. The isolation patterns may include an insulating material (e.g., silicon oxide). Impurity regions (not shown) may be formed at an upper portion of the substrate 100 between the isolation patterns.

The first conductive line 104 may extend in the first direction, and a plurality of first conductive lines 104 may be arranged in the second direction (e.g., spaced part from each other in the second direction). In example embodiments, the first conductive line 104 may be formed on the substrate 100 between the isolation patterns.

The first conductive line 104 may include a metal and/or a metal nitride. In example embodiments, the first conductive line 104 may include a first ohmic pattern 104a, a first metal pattern 104b, and a second ohmic pattern 104c sequentially stacked. The first and second ohmic patterns 104a and 104c may include a metal nitride (e.g., titanium nitride, tungsten nitride, tantalum nitride, zirconium nitride, etc.), or a metal silicon nitride (e.g., titanium silicon nitride, tungsten silicon nitride, tantalum silicon nitride, zirconium silicon nitride, etc.), but are not limited thereto. The first metal pattern 104b may include a metal, (e.g., tungsten (W), platinum (Pt), palladium (Pd), rhodium (Rh), ruthenium (Ru), iridium (Jr), copper (Cu), aluminum (Al), titanium (Ti), tantalum (Ta), etc., but are not limited thereto).

An upper surface of the first conductive line 104 may be flat. The first conductive line 104 may serve as a word line in the semiconductor device.

The first structure 120 may be formed on the first conductive line 104. A plurality of first structures 120 may be spaced apart from each other in the second direction.

The first structure 120 may have a pillar shape including the switching pattern 106b and the first electrode 108b sequentially stacked. Upper surfaces of the switching pattern 106b and the first electrode 108b may be flat. Thus, sidewalls of the first structure 120 may not be bent.

The switching pattern 106b may include, e.g., a diode. In example embodiments, the switching pattern 106b may include polysilicon doped with n-type impurities and polysilicon doped with p-type impurities. In example embodiments, the switching pattern 106b may include an oxide diode including an n-type metal oxide and a p-type metal oxide. The switching pattern 106b may include switching structures spaced apart from each other in the first direction on the first conductive line 104.

The first electrode 108b may include a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, etc.

An upper width in the second direction of the first conductive line 104 may be substantially the same as a lower width in the second direction of the first structure 120.

The first and second insulation patterns 126a and 126b may be formed on the substrate 100, and may fill a space between the first structures 120. The first and second insulation patterns 126a and 126b may protrude above the first structures 120.

The first insulation pattern 126a may have a first top surface, and the second insulation pattern 126b may have a second top surface. The first and second top surfaces may be higher than a top surface of the first structure 120.

In example embodiments, the second top surface may be higher than the first top surface. Thus, a first opening (see 127a in FIG. 11) defined by the first and second insulation patterns 126a and 126b may be formed on the first structure 120, and a plurality of first openings may be isolated from each other. A second opening (see 127b in FIG. 11) defined by the second isolation pattern 126b may be formed over the first openings, and the second opening may extend in the second direction.

The first and second insulation patterns 126a and 126b may include substantially the same material, and may be formed by substantially the same deposition process. In example embodiments, the first and second insulation patterns 126a and 126b may include a nitride (e.g., silicon nitride). In example embodiments, the first and second insulation patterns 126a and 126b may include other insulating materials (e.g., silicon oxide, silicon oxynitride).

In example embodiments, a first spacer 128a may be formed on upper sidewalls of the first insulation pattern 126a protruding above the first structure 120, and a second spacer 128b may be formed on upper sidewalls of the second insulation pattern 126b protruding above the first structure 120. That is, the first and second spacers 128a and 128b may be formed on the first electrode 108b, and may cover an edge portion of the first electrode 108b.

The first and second spacers 128a and 128b may include the same material or substantially the same material. The first and second spacers 128a and 128b may include a material having an etching selectivity with respect to the first and second insulation patterns 126a and 126b. In example embodiments, the first and second spacers 128a and 128b may include, e.g., silicon oxide. In example embodiments, the first and second spacers 128a and 128b may include, e.g., silicon nitride.

An inner width of the first opening may be decreased by the first and second spacers 128a and 128b, and an inner width of the second opening may be decreased by the second spacer 128b. Thus, the inner widths of first and second openings may be controlled by the thicknesses of the first and second spacers 128a and 128b.

In example embodiments, an etch stop pattern 110b may remain under the first and second spacers 128a and 128b.

The variable resistance pattern 130 may be formed on a central upper surface of the first electrode 108b, and may fill the first opening. A top surface of the variable resistance pattern 130 may be substantially coplanar with or lower than the top surface of the first insulation pattern 126b. The variable resistance pattern 130 may have a pillar shape, and a plurality of variable resistance patterns 130 may be isolated from each other.

A bottom of the variable resistance pattern 130 may be smaller than a top surface of the first electrode 108b. The first and second spacers 128a and 128b may contact sidewalls of the variable resistance pattern 130. An upper width of the variable resistance pattern 130 may be greater than a lower width of the variable resistance pattern 130, due to the shapes of the first and second spacers 128a and 128b.

In example embodiments, the variable resistance pattern 130 may include a material of which a resistance may be changed by a phase change or a phase transition. In this case, the semiconductor device may be a phase-change random access memory (PRAM) device. The variable resistance pattern 130 may include a chalcogenide-based material in which germanium (Ge), antimony (Sb) and/or tellurium (Te) are combined by a given ratio.

In example embodiments, the variable resistance pattern 130 may include a material of which a resistance may be changed by a magnetic field or a spin transfer torque (STT). In this case, the semiconductor device may be a magnetic random access memory (MRAM) device. The variable resistance pattern 130 may include a ferromagnetic material, e.g., iron (Fe), nickel (Ni), cobalt (Co), dysprosium (Dy), gadolinium (Gd), etc.

In example embodiments, the variable resistance pattern 130 may include, e.g., a transition metal oxide or a perovskite-based material. In this case, the semiconductor device may be a resistive random access memory (ReRAM) device.

The second electrode 132 may be formed on the variable resistance pattern 130 and the first insulation pattern 126a, and may fill the second opening. A top surface of the second electrode 132 may be substantially coplanar with or lower than the top surface of the second insulation pattern 126b. Thus, the second electrode 132 may extend in the second direction. The second spacer 128b may contact sidewalls of the second electrode 132.

The second electrode 132 may include a metal nitride, e.g., titanium nitride, tungsten nitride, tantalum nitride, zirconium nitride, etc., or a metal silicon nitride, e.g., titanium silicon nitride, tungsten silicon nitride, tantalum silicon nitride, zirconium silicon nitride, etc.

In example embodiments, the second conductive line 136 may be formed on the second electrode 132, and the second conductive line 136 may extend in the second direction. The second conductive line 136 may serve as a bit line. The second conductive line 136 may include a metal of which a resistance may be lower than a resistance of the second electrode 132. The second conductive line 136 may include, e.g., tungsten (W), platinum (Pt), palladium (Pd), rhodium (Rh), ruthenium (Ru), iridium (Ir), copper (Cu), aluminum (Al), titanium (Ti), tantalum (Ta), etc.

A top surface of the second conductive line 136 may be higher than the top surface of the second insulation pattern 126b.

As described above, the first and second conductive lines 104 and 136 may cross each other, and a memory cell may be formed at a cross point of the first and second conductive lines 104 and 136. The memory cell may include the switching pattern 106b, the first electrode 108b, the variable resistance pattern 130 and the second electrode 132 sequentially stacked in the third direction.

The semiconductor device may include the variable resistance pattern 130 and the second electrode 132 on the first structure 120, and may fill the first and second openings defined by the first and second insulation patterns 126a and 126b. Thus, the first structure 120, the variable resistance pattern 130 and the second electrode 132 may be self-aligned in the third direction, so that the mis-alignment among the first structure 120, the variable resistance pattern 130 and the second electrode 132 may decrease. That is, failures due to the mis-alignment may decrease.

Figure 29:
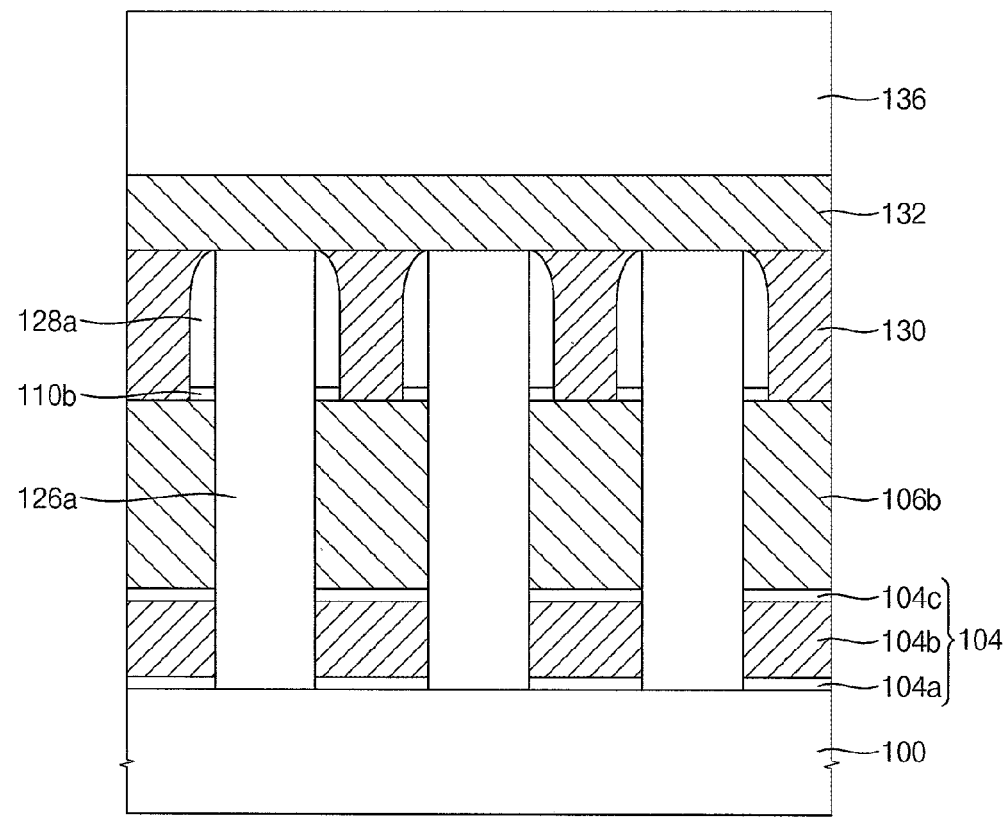
FIGS. 29 to 30 are cross-sectional views illustrating a semiconductor device in accordance with example embodiments.
Figure 30:
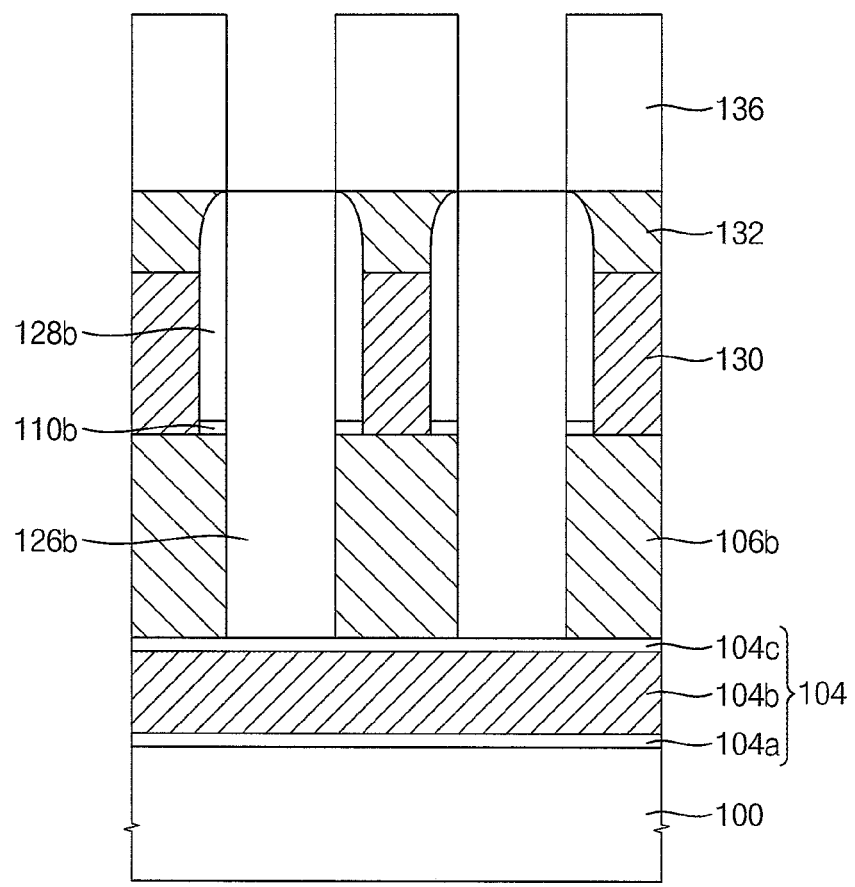

FIGS. 29 to 30 are cross-sectional views illustrating a semiconductor device in accordance with example embodiments.

Referring to FIGS. 29 and 30, the semiconductor device may be similar to a semiconductor device shown in FIGS. 1 to 3, except that the first electrode 108b may be omitted and the variable resistance pattern 130 may be formed directly on the switching pattern 106b.

FIGS. 4 to 14 are cross-sectional views illustrating stages of a method of manufacturing a semiconductor device in accordance with example embodiments.

Figure 4:
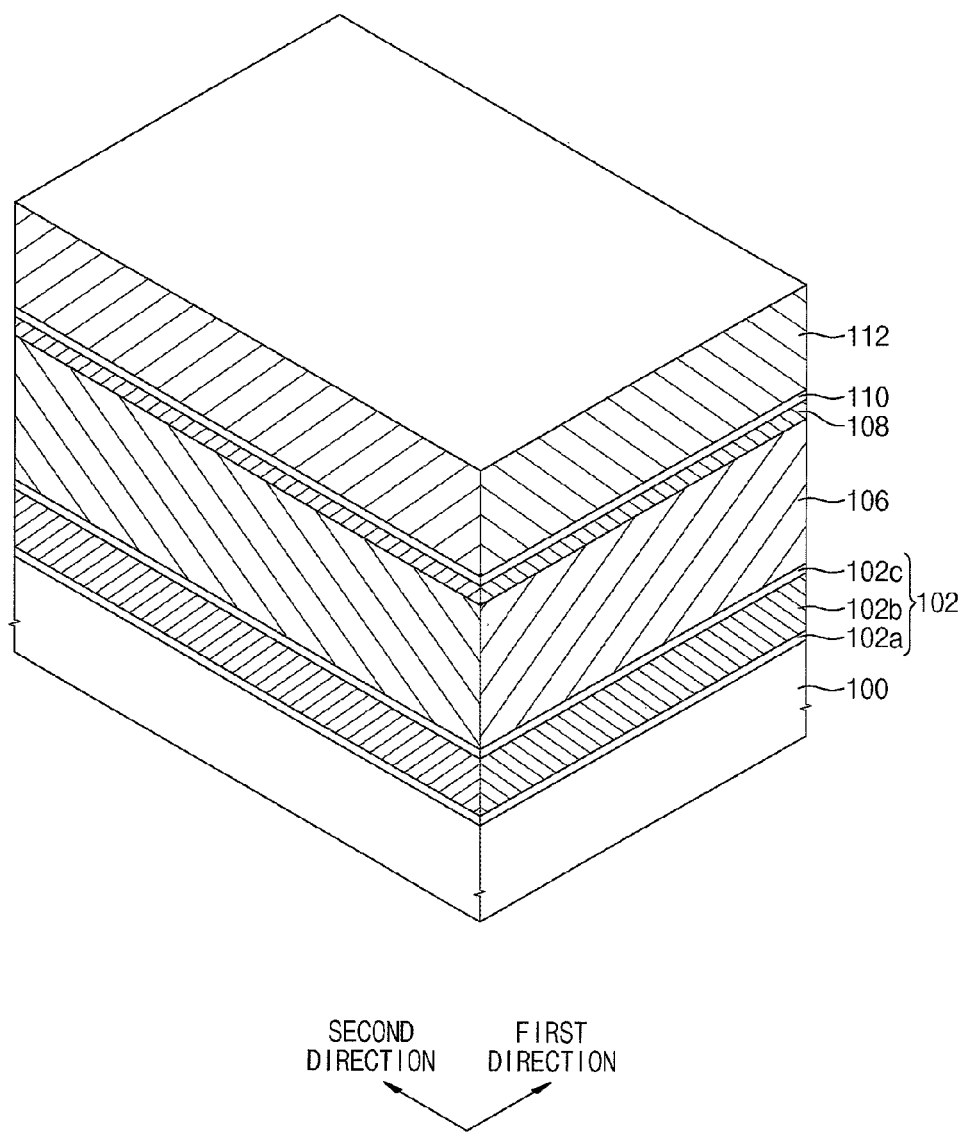
FIGS. 4 to 14 are cross-sectional views illustrating stages of a method of manufacturing the semiconductor device in accordance with example embodiments.

Referring to FIG. 4, a first conductive layer 102, a switching layer 106, a first electrode layer 108, an etch stop layer 110 and a first hard mask layer 112 may be sequentially formed on a substrate 100.

In example embodiments, isolation patterns (not shown) may be formed on the substrate 100 by performing a shallow trench isolation (STI) process. The isolation patterns may extend in the first direction. Portions of the substrate 100 between the isolation patterns may be doped with impurities to form impurity regions (not shown).

The first conductive layer 102 may be formed of a metal or a metal nitride.

In example embodiments, the first conductive layer 102 may include a first ohmic layer 102a, a first metal layer 102b and a second ohmic layer 102c sequentially stacked. The first and second ohmic layers 102a and 102c may be formed of a metal nitride, e.g., titanium nitride, tungsten nitride, tantalum nitride, zirconium nitride, etc., or a metal silicon nitride, e.g., titanium silicon nitride, tungsten silicon nitride, tantalum silicon nitride, zirconium silicon nitride, etc. The first metal layer 102b may be formed of a metal, e.g., tungsten (W), platinum (Pt), palladium (Pd), rhodium (Rh), ruthenium (Ru), iridium (Ir), copper (Cu), aluminum (Al), titanium (Ti), tantalum (Ta), etc.

The switching layer 106 may be formed of a semiconductor material for forming a diode. In example embodiments, the switching layer 106 may include polysilicon doped with n-type impurities and polysilicon doped with p-type impurities. In example embodiments, the switching layer 106 may be an oxide diode including an n-type metal oxide and a p-type metal oxide.

The first electrode layer 108 may be formed of a metal nitride, e.g., titanium nitride, tungsten nitride, tantalum nitride, zirconium nitride, etc., or a metal silicon nitride, e.g., titanium silicon nitride, tungsten silicon nitride, tantalum silicon nitride, zirconium silicon nitride, etc.

The etch stop layer 110 may be formed of a material having an etching selectivity with respect to the first hard mask layer 112. In example embodiments, the etch stop layer 110 may be formed of silicon nitride. In example embodiments, the etch stop layer 110 may not be formed.

In example embodiments, the first hard mask layer 112 may be formed of silicon oxide. In example embodiments, the first hard mask layer 112 may be formed of silicon nitride. Hereinafter, an example where the first hard mask layer 112 includes silicon oxide will be described.

The first conductive layer 102, the switching layer 106, the first electrode layer 108, the etch stop layer 110 and the first hard mask layer 112 may be formed by a deposition process (e.g., a physical vapor deposition (PVD) process, a sputtering process, an atomic layer deposition (ALD) process, a chemical vapor deposition (CVD) process, etc.). The first conductive layer 102, the switching layer 106, the first electrode layer 108, the etch stop layer 110 and the first hard mask layer 112 may be formed on a flat top surface of the substrate 100, so that top surfaces of the first conductive layer 102, the switching layer 106, the first electrode layer 108, the etch stop layer 110 and the first hard mask layer 112 may be substantially flat.

Figure 5:
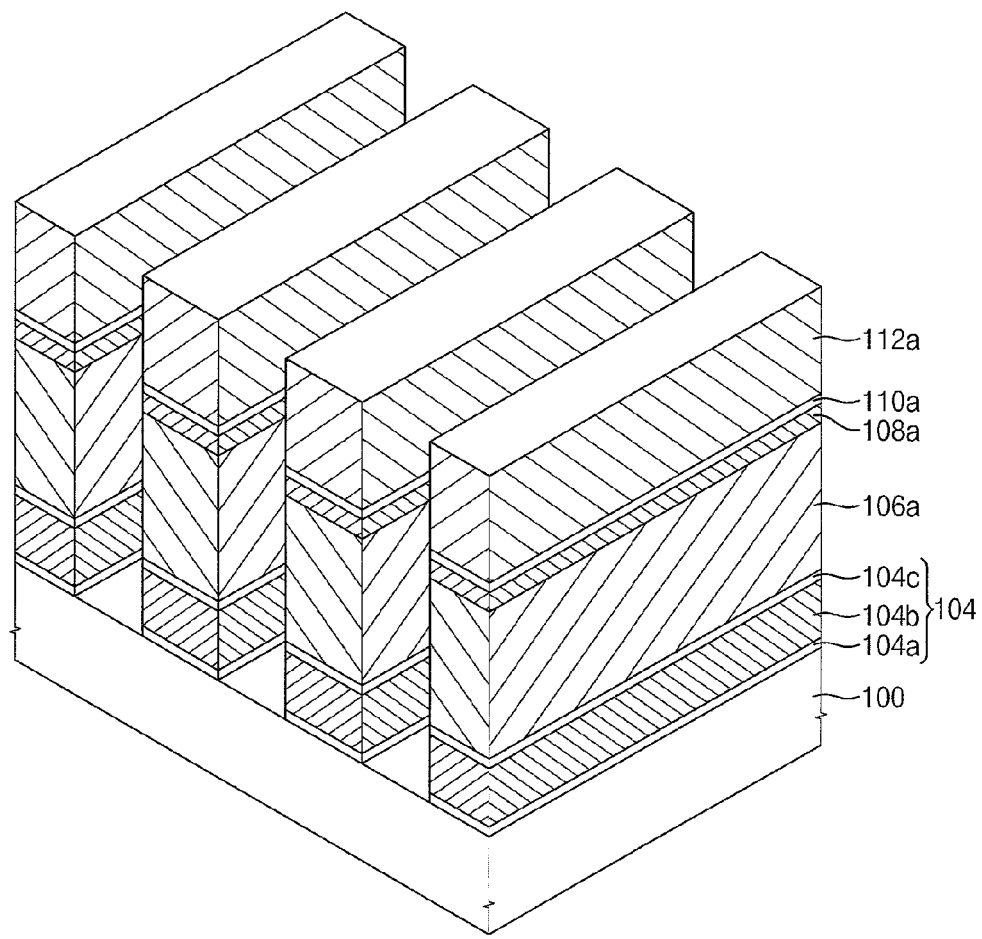

Referring to FIG. 5, the first hard mask layer 112 may be patterned to form a preliminary first hard mask 112a extending in the first direction. The etch stop layer 110, the first electrode layer 108, the switching layer 106 and the first electrode layer 102 may be anisotropically etched using the preliminary first hard mask 112a as an etching mask. Thus, a first conductive line 104, a preliminary switching pattern 106a, a preliminary first electrode 108a, a preliminary etch stop pattern 110a and a preliminary first hard mask 112 may be formed on the substrate 100, which may define a preliminary first structure.

The preliminary first structure may extend in the first direction. A plurality of preliminary first structures may be arranged in the second direction. The first conductive line 104 may include a first ohmic pattern 104a, a first metal pattern 104b and a second ohmic pattern 104c sequentially stacked. The first conductive line 104 may serve as a word line of the semiconductor device.

According to a height of the preliminary first hard mask 112a, a height of a variable resistance pattern 130 (refer to FIG. 13) subsequently formed may be controlled. In example embodiments, the preliminary first hard mask 112a may be formed to have a height substantially the same as a height of the variable resistance pattern 130.

Figure 6:
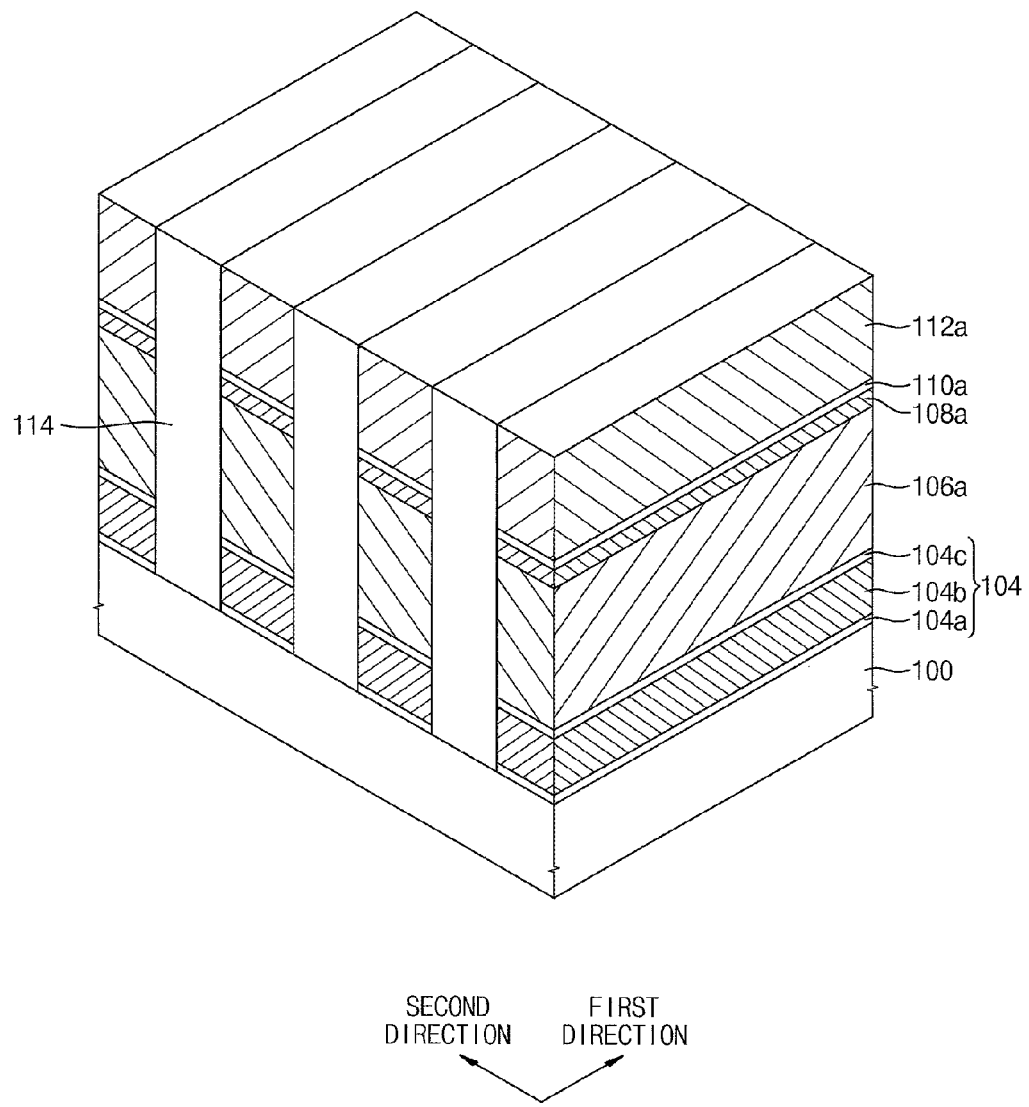

Referring to FIG. 6, a sacrificial layer may be formed to fill a space between the preliminary first structures, and the sacrificial layer may be planarized until top surfaces of the preliminary first structures may be exposed to form a first sacrificial pattern 114. The planarization process may be performed by a chemical mechanical polishing (CMP) process and/or an etch back process.

The sacrificial layer may be formed of a material having an etch selectivity with respect to the preliminary first hard mask 112a. The material of the sacrificial layer may be easily removed by an isotropic etching process, and may have good gap filling characteristics. In example embodiments, the sacrificial layer may include, e.g., spin on hard mask (SOH) including carbon.

Figure 7:
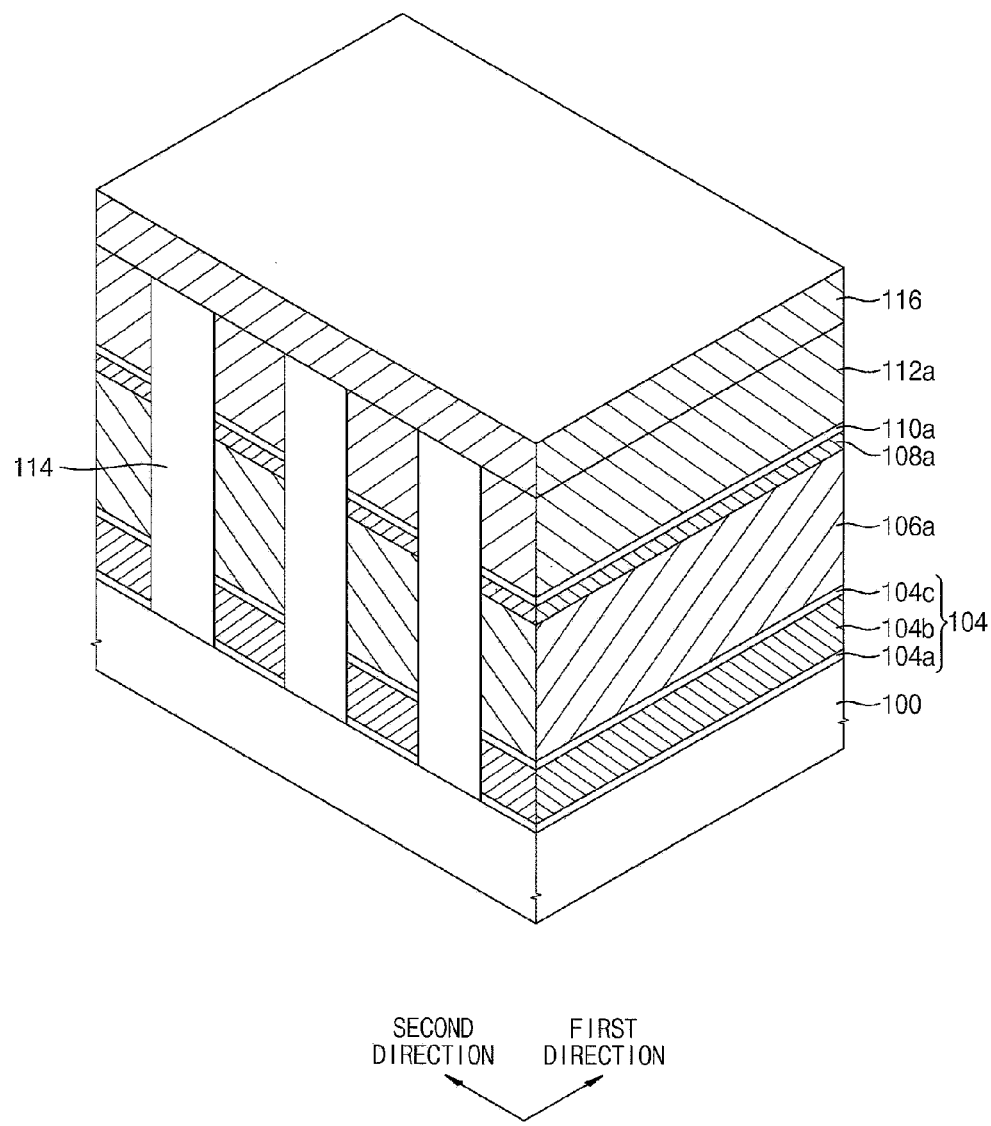

Referring to FIG. 7, a second hard mask layer 116 may be formed on the preliminary first structure and the first sacrificial pattern 114. The second hard mask layer 116 may be formed of a material that is the same (or substantially the same) as a material of the preliminary first hard mask 112a. In example embodiments, the second hard mask may be formed of silicon oxide.

According to a height of the second hard mask layer 116, a height of a second electrode 132 (refer to FIG. 14) subsequently formed may be controlled. In example embodiments, the second hard mask layer 116 may be formed to have a thickness greater than a thickness of the second electrode 132.

Figure 8:
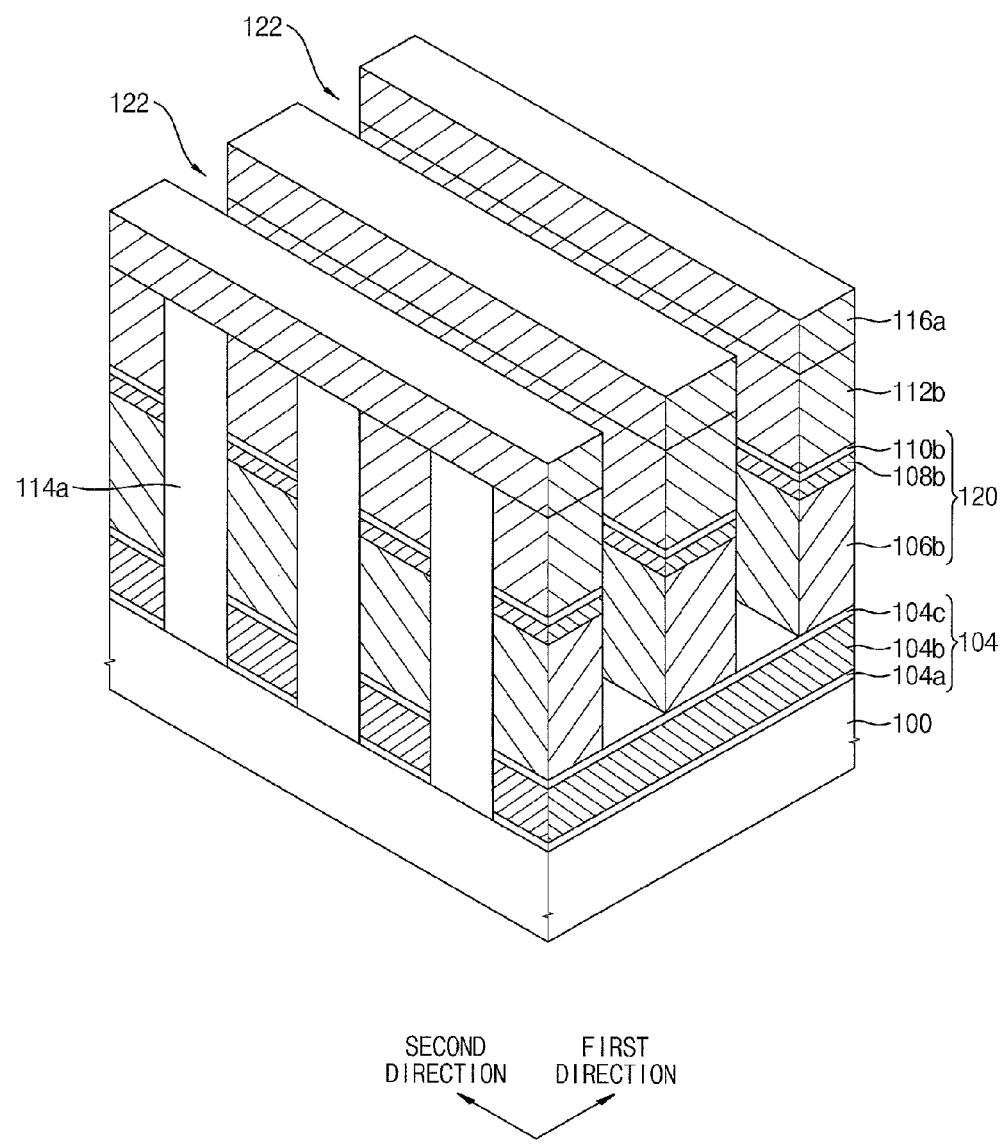

Referring to FIG. 8, the second hard mask layer 116 may be patterned to form a second hard mask 116a extending in the second direction. The first sacrificial pattern 114, the preliminary first hard mask 112a, the preliminary etch stop pattern 110a, the preliminary first electrode 108a and the preliminary switching pattern 106a may be anisotropically etched using the second hard mask 116a as an etching mask. In the etching process, the first conductive line 104 may not be etched.

Thus, a first structure 120 and a first hard mask 112b may be formed on the first conductive line 104, and the first structure 120 may include a switching pattern 106a, a first electrode 108b and an etch stop pattern 110b sequentially stacked. A plurality of first structures 120 may be formed on the first conductive line 104 to be spaced apart from each other. Also, the first structures 120 may be arranged in the second direction.

By performing the processes, the first conductive line 104 and the first structure 120 included in each of memory cells may be formed. The first conductive layer 102 may be etched in the first direction to form the first conductive line 104. The layers formed on the first conductive layer 102 may be etched in each of the first direction and the second direction to form the first structure 120 having a pillar shape. Thus, the first structure 120 and the first conductive line 104 may be exactly aligned with each other. That is, a lower width in the second direction of the first structure 120 may be substantially the same as an upper width in the second direction of the first conductive line 104. Upper surfaces of the switching pattern 106b and the first electrode 108b may be flat.

The first sacrificial pattern 114 may be etched to form a second sacrificial pattern 114a between stacked structures of the first structure 120 and the first hard mask 112b in the second direction. Also, a first trench 122 may be formed between the first structures 120 in the first direction, and may extend in the second direction.

Figure 9:
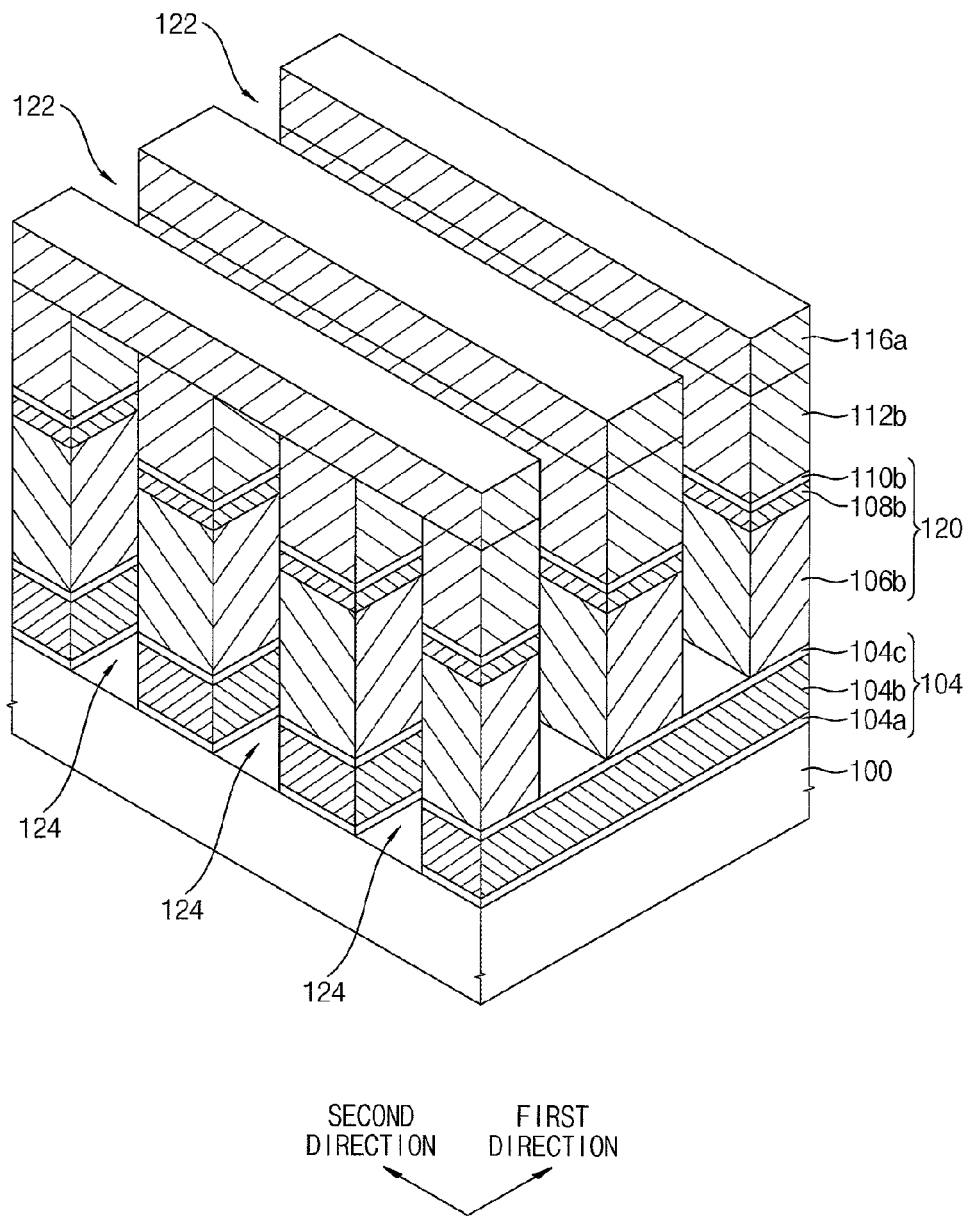

Referring to FIG. 9, the second sacrificial pattern 114a may be removed by an isotropic etching process. Alternatively, the second sacrificial pattern 114a may be removed by an ashing process and/or a stripping process.

A first gap 124 may be formed under the second hard mask 116a by removing the second sacrificial pattern 114a, and the first gap 124 may be in communication with the first trench 122.

Figure 10:
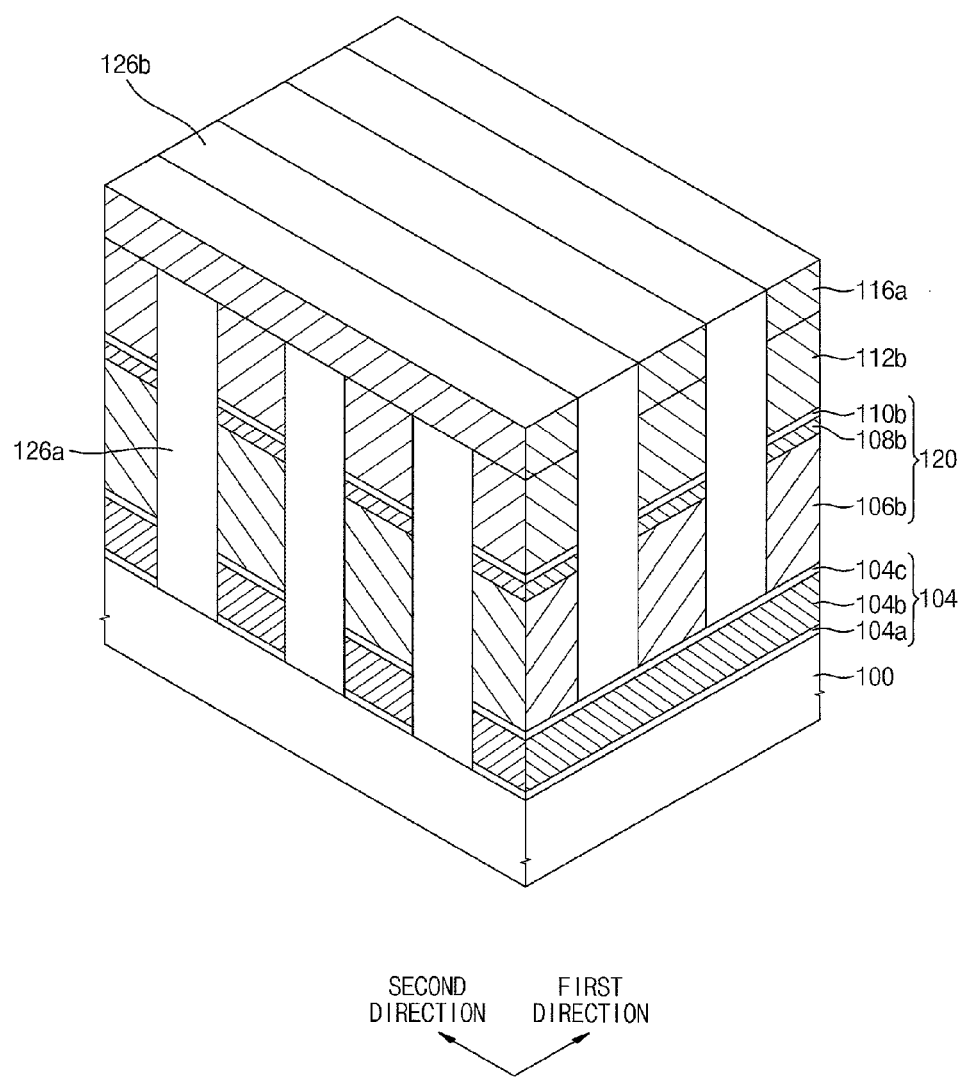

Referring to FIG. 10, a first insulation pattern 126a and a second insulation pattern 126b may be formed to fill the first gap 124 and the first trench 122, respectively.

Particularly, an insulation layer may be formed to sufficiently fill the first gap 124 and the first trench 122. The insulation layer may be formed of a material having an etch selectivity with respect to the first and second hard masks 112b and 116a. In example embodiments, the insulation layer may be formed of silicon nitride or silicon oxynitride.

The insulation layer may be planarized until a top surface of the second hard mask 116a may be exposed. The planarization process may be performed by a CMP process and/or an etch back process. Thus, the first insulation pattern 126a may be formed to fill the first gap 124, and the second insulation pattern 126b may be formed to fill the first trench 122.

The first and second insulation patterns 126a and 126b may be a single structure including substantially the same material. The first and second insulation patterns 126a and 126b may cross each other.

The first insulation pattern 126a may be formed between the first structures 120 in the second direction. The first insulation pattern 126a may have a pillar shape. The second hard mask 116a may be formed on the first insulation pattern 126a. A top surface of the first insulation pattern 126a may be substantially coplanar with a top surface of the first hard mask 112b. Thus, the top surface of the first insulation pattern 126a may be lower than a top surface of the second hard mask 116a.

In example embodiments, a height of the second electrode 132 subsequently formed may be controlled by a height of the second hard mask 116a. The height of the second hard mask 116a may be controlled by the planarization process.

In example embodiments, the height of the second hard mask 116a may be substantially the same as the height of the second electrode.

Figure 11:
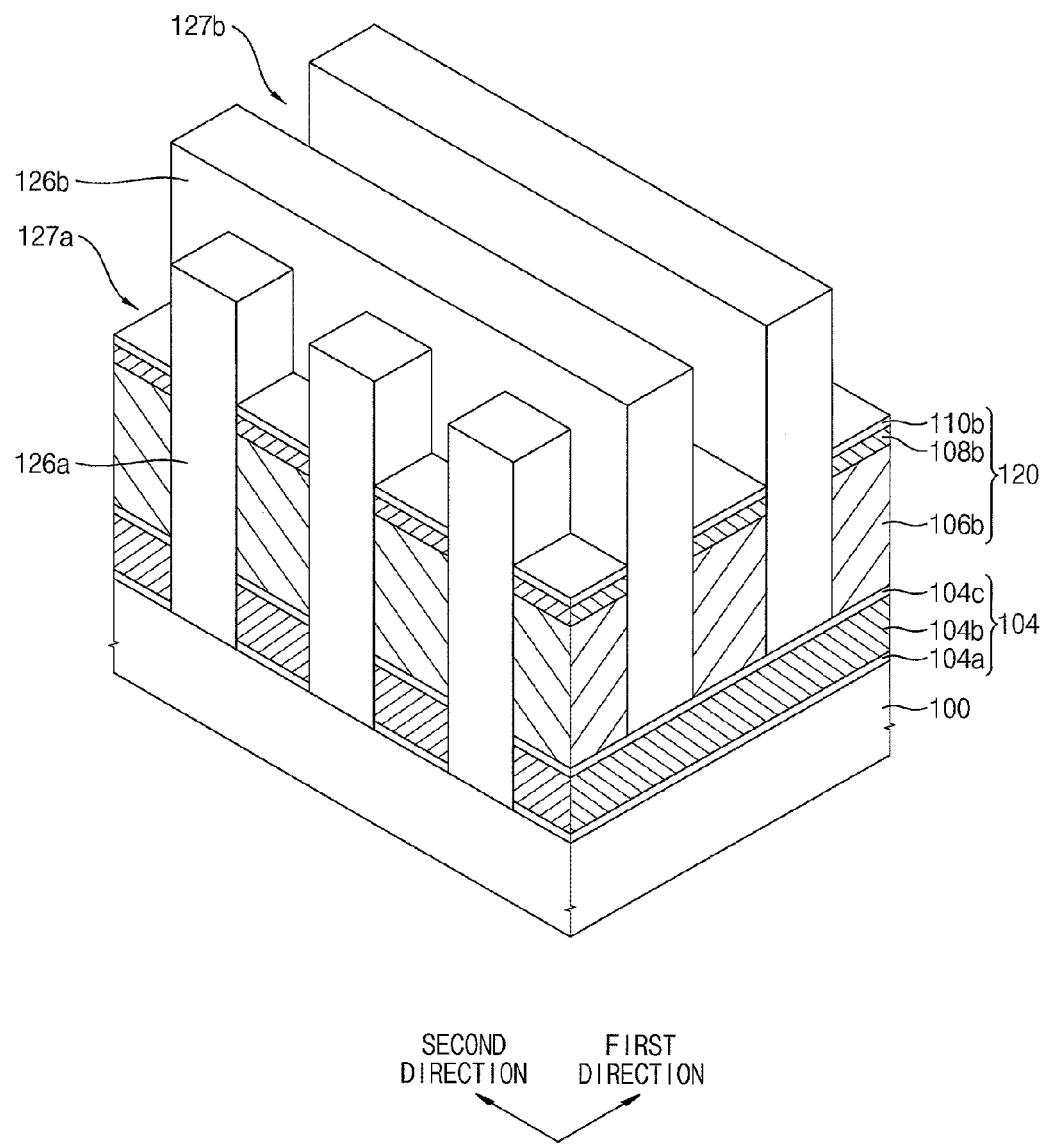

Referring to FIG. 11, the first and second hard masks 112b and 116a may be removed by an etching process (e.g., an isotropic etching process).

When the first and second hard masks 112b and 116a include silicon oxide, the first and second hard masks 112b and 116a may be removed using an etchant including HF.

By the etching process, the first and second insulation patterns 126a and 126b may protrude from the first structures 120. The first insulation pattern 126a may have a first top surface, and the second insulation pattern 126b may have a second top surface. The first and second surfaces may be higher than a top surface of the first structure 120. In example embodiments, the second surface may be higher than the first surface.

The first hard mask 112b may be removed to form a first opening 127a. That is, the first opening 127a may be formed on the first structure 120, and defined by the first and second insulation patterns 126a and 126b. A plurality of the first openings 127a may be isolated from each other. The second hard mask 116a may be removed to form a second opening 127b. That is, the second opening 127b may be formed over the first openings 127a, and may extend in the second direction.

Figure 12:
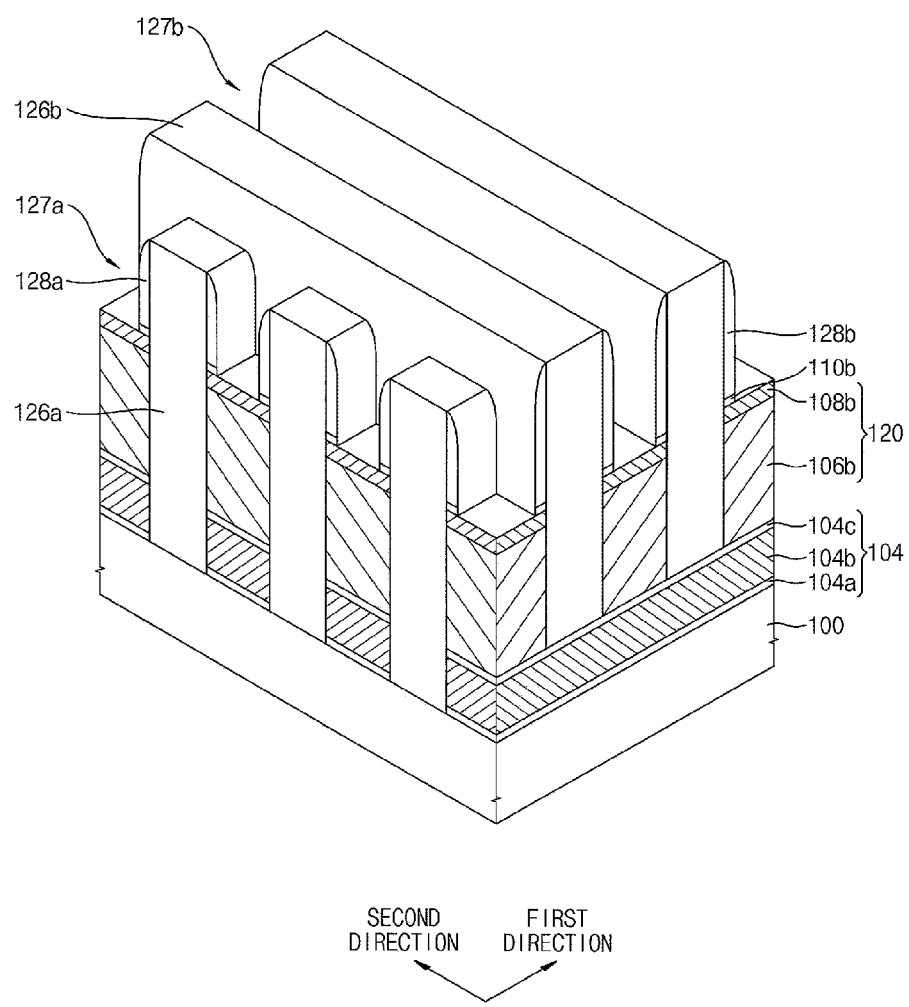

Referring to FIG. 12, a first spacer 128a and a second spacer 128b may be formed on upper sidewalls of the first and second insulation patterns 126a and 126b protruding from the first structure 120, respectively. The etch stop pattern 110b may be etched to expose the first electrode 108b by the first and second openings 127a and 127b.

In example embodiments, an insulation spacer layer may be conformally formed on inner walls of the first and second openings 127a and 127b and the top surfaces of the first and second insulation patterns 126a and 126b. The insulation spacer layer and the etch stop pattern 110b under the insulation spacer layer may be anisotropically etched to form the first and second spacers 128a and 128b. Inner widths of the first and second openings 127a and 127b may be decreased by the first and second spacers 128a and 128b. Particularly, the inner width of first opening 127a may be controlled by thicknesses of the first and second spacers 128a and 128b, and the inner width of second opening 127a may be controlled by thicknesses of the second spacers 128b.

In example embodiments, the first and second spacers 128a and 128b may be formed on the first electrode 108b to cover an edge portion of the first electrode 108b. Thus, a central upper surface of the first electrode 108b may be exposed by the first opening 127a. The first opening 127a may have an upper width greater than a lower width according to the shapes of the first and second spacers 128a and 128b.

The first and second spacers 128a and 128b may be formed of a material having an etching selectivity with respect to the first and second insulation patterns 126a and 126b. In example embodiments, the first and second spacers 128a and 128b may include silicon oxide.

Figure 13:
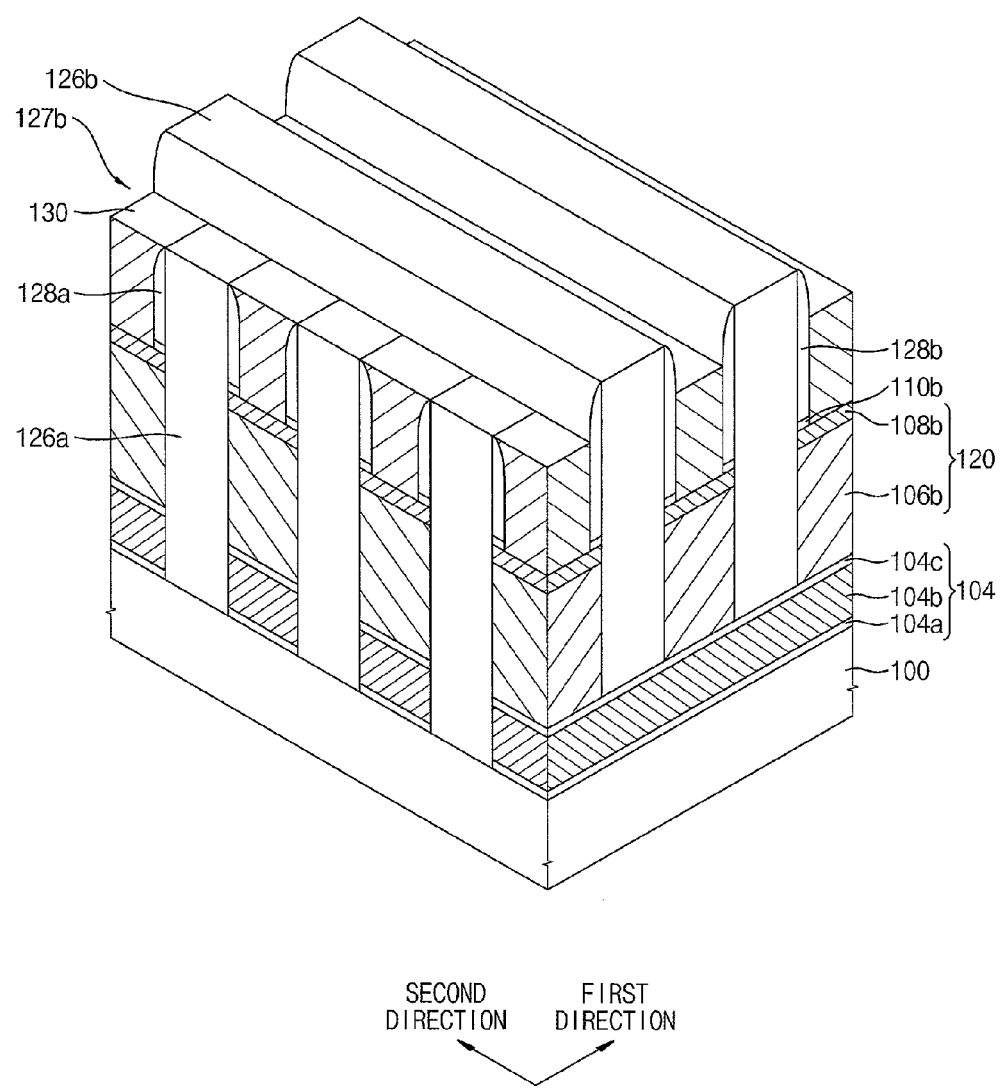

Referring to FIG. 13, a variable resistance pattern 130 may be formed in the first opening 127a.

Particularly, a variable resistance layer may be formed on the first and second insulation patterns 128a and 128b to fill the first opening 127a. The variable resistance layer may be etched until the top surface of the first insulation pattern 128a may be exposed. Thus, the variable resistance layer may be separated to form the variable resistance patterns 130 filling the first openings 127a, respectively. A top surface of the variable resistance pattern 130 may be substantially coplanar with or lower than the top surface of the first insulation pattern 126a.

The variable resistance pattern 130 may contact the central upper surface of the first electrode 108b. A bottom of the variable resistance pattern 130 may be smaller (e.g., have a smaller area) than a top surface of the first electrode 108b.

As described above, the variable resistance pattern 130 may be formed by a damascene process. The variable resistance pattern 130 may be self-aligned with the first electrode 108b, so that the mis-alignment between the variable resistance pattern 130 and the first electrode 108b may decrease.

In example embodiments, the variable resistance pattern 130 may include a phase change material. In this case, the semiconductor device may be a PRAM device. The variable resistance pattern 130 may include a chalcogenide-based material in which germanium (Ge), antimony (Sb) and/or tellurium (Te) are combined by a given ratio.

In example embodiments, the variable resistance pattern 130 may include a material of which a resistance may be changed by a magnetic field or a spin transfer torque (STT). In this case, the semiconductor device may be an MRAM device. The variable resistance pattern 130 may include a ferromagnetic material, e.g., iron (Fe), nickel (Ni), cobalt (Co), dysprosium (Dy), gadolinium (Gd), etc.

In example embodiments, the variable resistance pattern 130 may include, e.g., a transition metal oxide or a perovskite-based material. In this case, the semiconductor device may be a ReRAM device.

Figure 14:
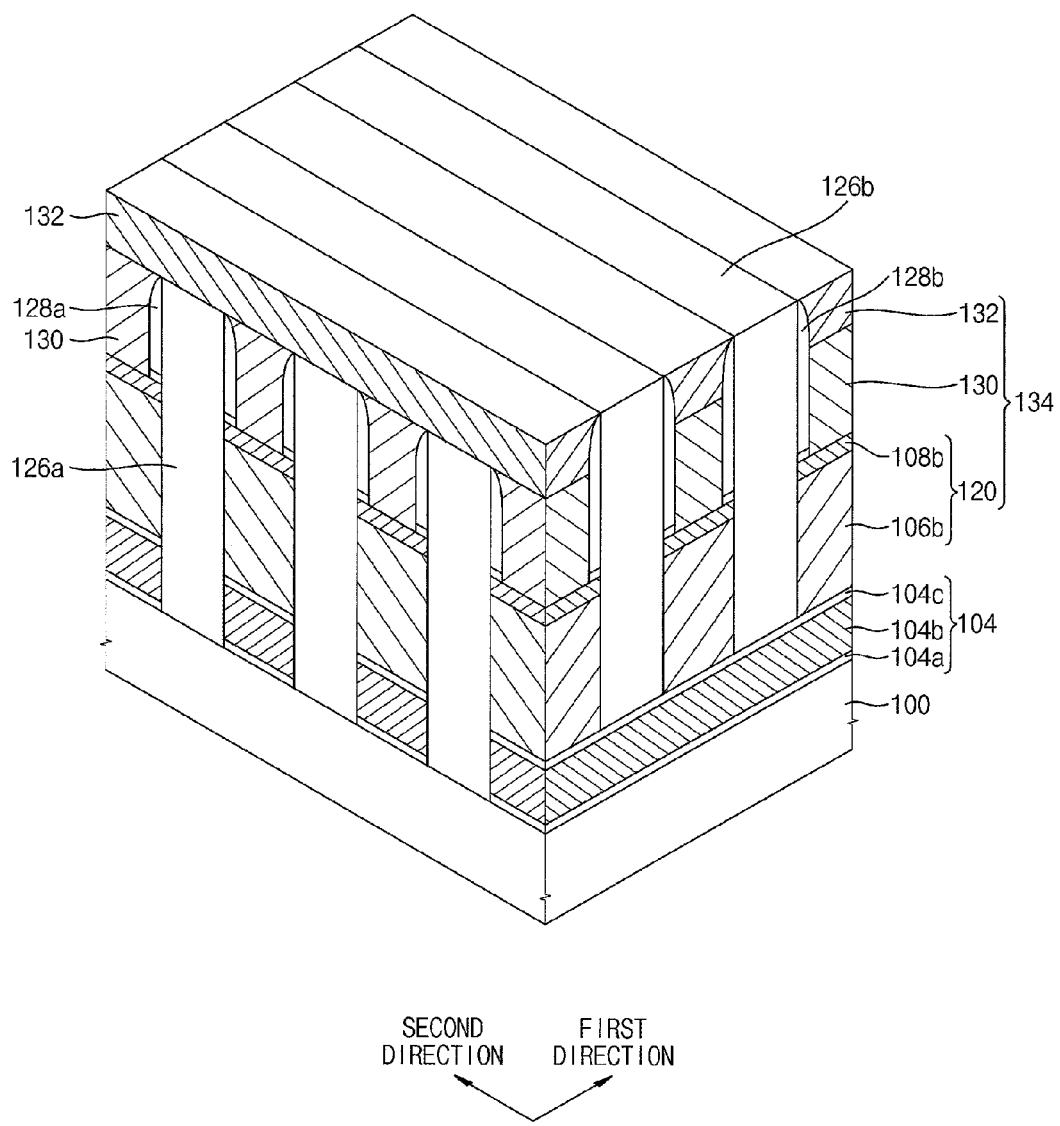

Referring to FIG. 14, a second electrode 132 may be formed on the variable resistance pattern 130 and the first insulation pattern 126a to fill the second opening 127b. The second electrode 132 may extend in the second direction.

Particularly, a second electrode layer may be formed on the variable resistance pattern 130 and the first and second insulation patterns 126a and 126b to fill the second opening 127b. The second electrode layer may be planarized until a top surface of the second insulation pattern 126b may be exposed to form the second electrode 132. The planarization process may be performed by a CMP process and/or an etch back process. That is, a top surface of the second electrode 132 may be substantially coplanar with or lower than the top surface of the second insulation pattern 126b.

In example embodiments, the second electrode 132 may be formed of a metal nitride, e.g., titanium nitride, tungsten nitride, tantalum nitride, zirconium nitride, etc., or a metal silicon nitride, e.g., titanium silicon nitride, tungsten silicon nitride, tantalum silicon nitride, zirconium silicon nitride, etc. However, example embodiments are not limited thereto, an other materials may be suitable for forming the second electrode 132.

As described above, the second electrode 132 may be formed by a damascene process. The second electrode 132 may be self-aligned with the variable resistance pattern 130, so that the mis-alignment between the second electrode 132 and the variable resistance pattern 130 may decrease.

Referring to FIGS. 1 to 3 again, a second conductive line 136 may be formed on the second electrode 132 to extend in the second direction.

Particularly, a second conductive layer may be formed on the second electrode 132 and the second insulation pattern 126b, and the second conductive layer may be patterned to form the second conductive line 136. The second conductive line 136 may be formed of a metal having a resistance lower than a resistance of the second electrode 132. The second conductive line 136 may be formed of, e.g., tungsten (W), platinum (Pt), palladium (Pd), rhodium (Rh), ruthenium (Ru), iridium (Jr), copper (Cu), aluminum (Al), titanium (Ti), tantalum (Ta), etc.

The second conductive line 136 may serve as a bit line. A top surface of the second conductive line 136 may be higher than the top surface of the second insulation pattern 126b.

As described above, the first conductive line 104, the switching pattern 106b and the first electrode 108b may be formed by embossed etching processes, respectively, so that the mis-alignment may decrease. The variable resistance pattern 130 and the second electrode 312 may be formed by an intaglio etching process, and may be self-aligned with the first electrode 108b. Thus, failures due to the mis-alignment may decrease.

Figure 15:
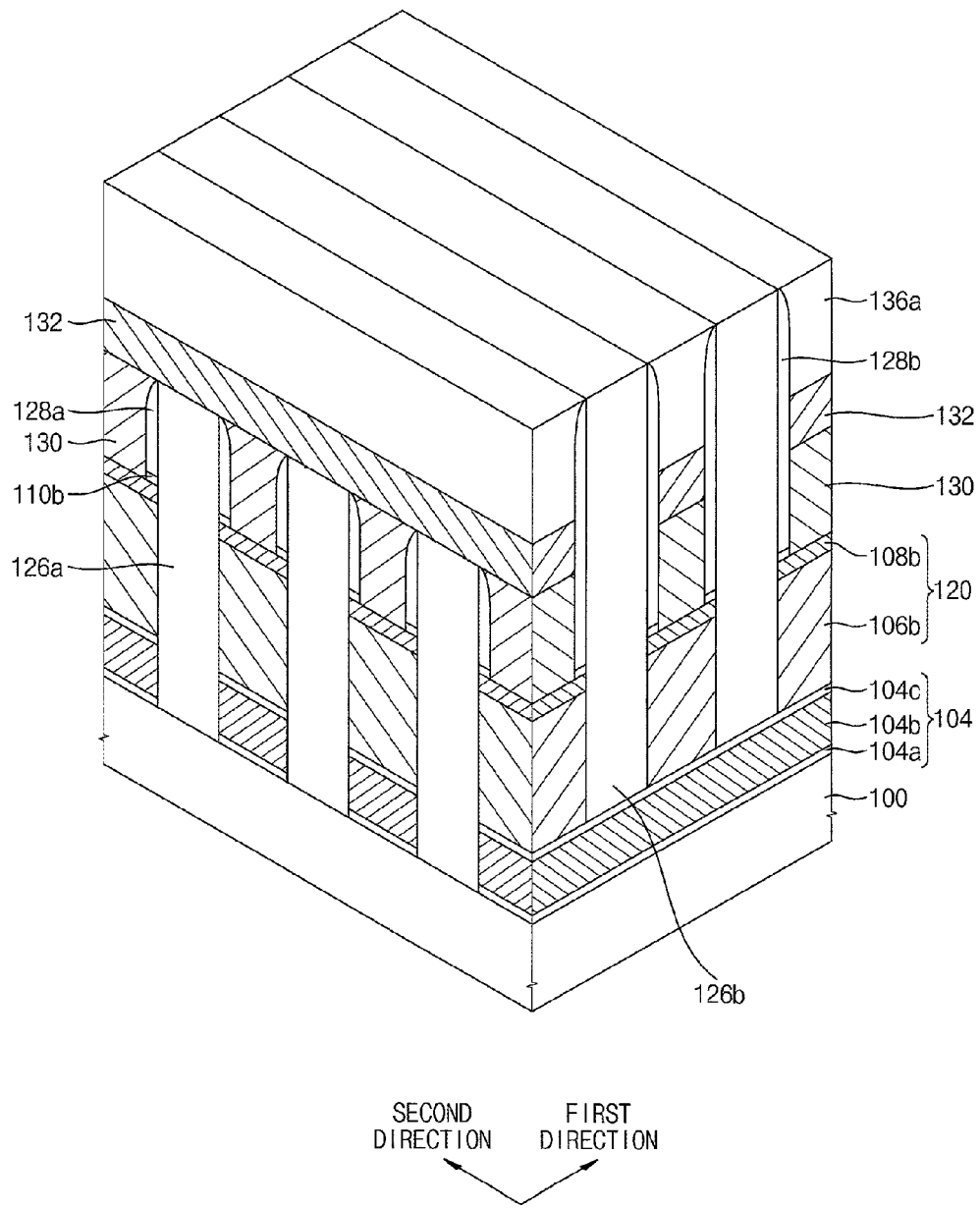
FIG. 15 is a perspective view illustrating a semiconductor device in accordance with example embodiments.

FIG. 15 is a perspective view illustrating a semiconductor device in accordance with example embodiments.

The semiconductor devices may be substantially the same as or similar to that illustrated with reference to FIGS. 1 to 3, except that the top surface of the second electrode is lower than the top surface of the second insulation pattern, and that the top surface of the second conductive line is substantially coplanar with the top surface of the second insulation pattern.

Referring to FIG. 15, a first conductive line 104, a plurality first structures 120, a first insulation pattern 126a, a second insulation pattern 126b, a variable resistance pattern 130 and a second electrode 132 may be formed on a substrate 100. Each of the first structures 120 may include a switching pattern 106b and a first electrode 108b sequentially stacked. A second conductive line 136a may be formed on the second electrode 132.

The first and second insulation patterns 126a and 126b may be formed on the substrate 100, and may fill a space between the first structures 120. The first and second insulation patterns 126a and 126b may protrude above the first structures 120.

The first insulation pattern 126a may fill a space between the first structures 120 in the second direction, and the second insulation pattern 126b may fill a space between the first structures 120 in the first direction. The first insulation pattern 126a may have a pillar shape, and a plurality of first insulation patterns 126a may be spaced apart from each other. The second insulation pattern 126b may extend in the second direction.

The first insulation pattern 126a may have a first top surface, and the second insulation pattern 126b may have a second top surface. The first and second top surfaces may be higher than a top surface of the first structure 120.

The variable resistance pattern 130 may be formed on the first electrode 108b, and may fill a first opening defined by the first and second insulation patterns 126a and 126b.

The second electrode 132 and second conductive line 136a may be sequentially stacked on the variable resistance pattern 130 and the first insulation pattern 126a, and may extend in the second direction. The second electrode 132 and the second conductive pattern 126b may be formed to fill the second opening defined by the second insulation patterns 126b over the variable resistance pattern 130.

Thus, a top surface of the second conductive line 136a may be substantially coplanar with the top surface of the second insulation pattern 126b.

Figure 16:
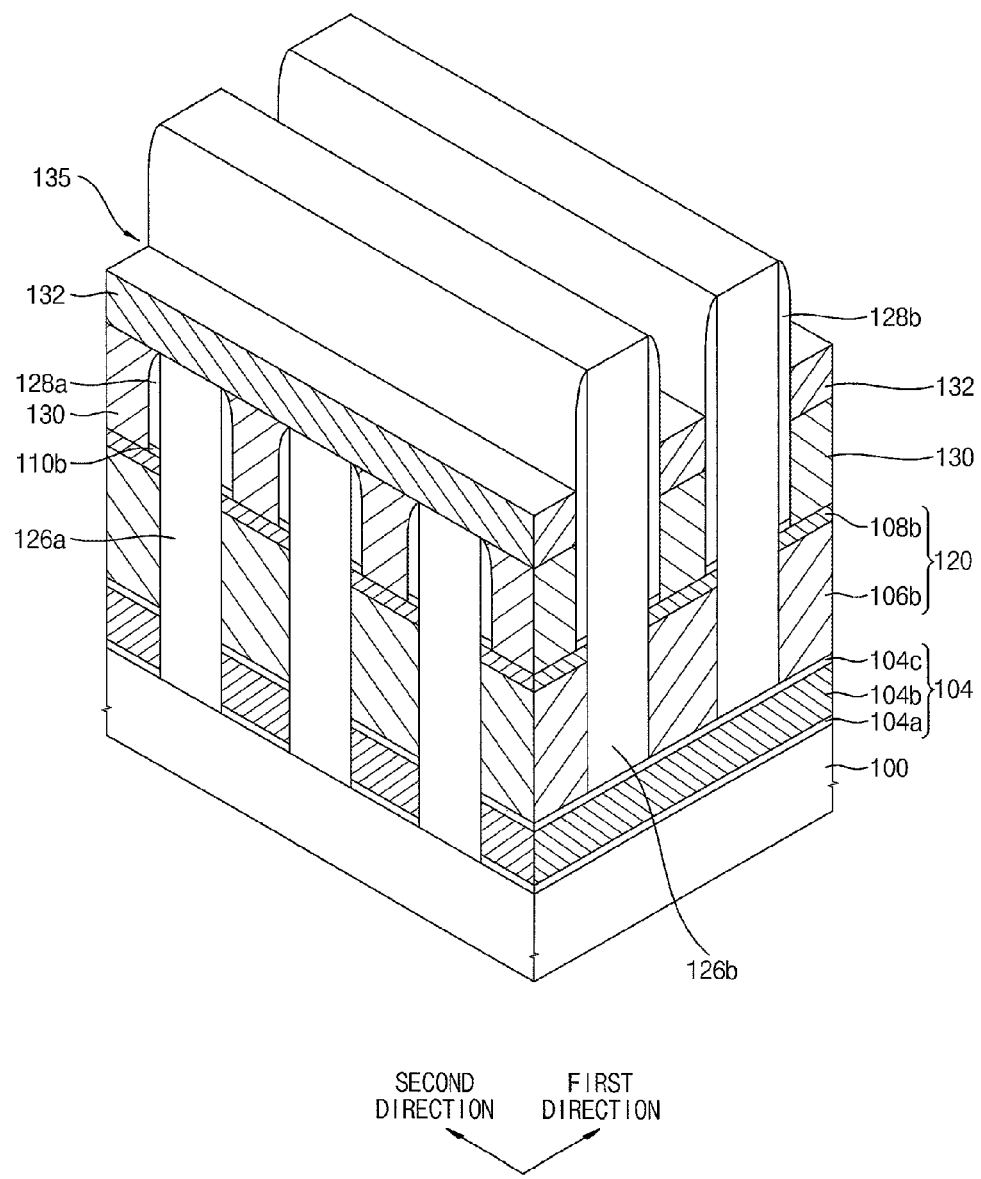
FIG. 16 is a perspective view illustrating stages of a method of manufacturing the semiconductor device in accordance with example embodiments.

FIG. 16 is a perspective view illustrating stages of a method of manufacturing a semiconductor device in accordance with example embodiments.

First, processes substantially the same as or similar to those illustrated with reference to FIGS. 4 to 13 may be performed. However, a second hard mask layer may be formed to have a thickness greater than a thickness of the second hard mask layer shown in FIG. 7. In example embodiments, the thickness of the second hard mask layer may be greater than the sum of thicknesses of the second electrode 132 and the second conductive line 136a. Thus, a height difference between top surfaces of the first and second insulation patterns 126a and 126b may increase.

Referring to FIG. 16, the second electrode 132 may be formed on the variable resistance pattern 130 and the first insulation pattern 126a to fill the second opening. The second electrode 132 may extend in the second direction.

Particularly, a second electrode layer may be formed on the variable resistance pattern 130 and the first and second insulation patterns 126a and 126b to fill the second opening. The second electrode layer may be etched back to form the second electrode 132 partially filling the second opening. That is, a top surface of the second electrode 132 may be lower than the top surface of the second insulation pattern 126b. Thus, a third opening 135 may be formed over the second electrode 126b.

As described above, the second electrode 132 may be formed by a damascene process, so that the second electrode 132 may be self-aligned with the variable resistance pattern 130. Thus, the mis-alignment between the second electrode 132 and the variable resistance pattern 130 may decrease.

Referring to FIG. 15 again, a second conductive line 136a may be formed on the second electrode 132 to fill the third opening 135, and may extend in the second direction.

Particularly, a second conductive layer may be formed on the second electrode 132 to fill the third opening 135, and the second conductive layer may be planarized until a top surface of the second insulation pattern 126b may be exposed to form the second conductive line 136a. The planarization process may be performed by a CMP process and/or an etch back process.

As described above, the second conductive line 136a may be formed by a damascene process, so that the second conductive line 136a may be self-aligned with the second electrode 132. Thus, the mis-alignment between the second conductive line 136a and the second electrode 132 may decrease.

Figure 17:
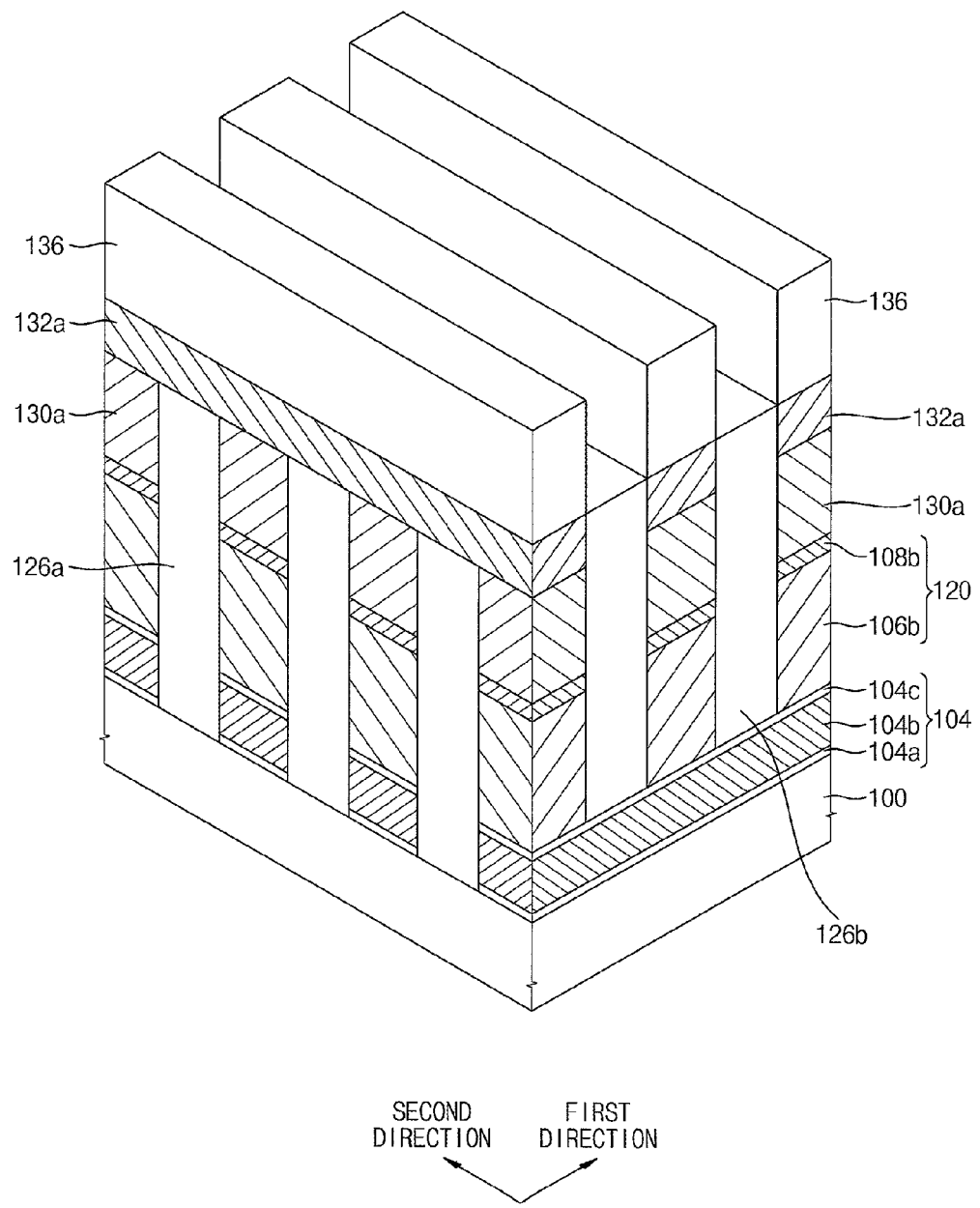
FIG. 17 is a perspective view illustrating a semiconductor device in accordance with example embodiments.

FIG. 17 is a perspective view illustrating a semiconductor device in accordance with example embodiments.

The semiconductor devices may be substantially the same as or similar to that illustrated with reference to FIGS. 1 to 3, except that the first and second spacers are not formed on sidewalls of the first and second insulation patterns, respectively.

Referring to FIG. 17, a first conductive line 104, a plurality of first structures, a first insulation pattern 126a, a second insulation pattern 126b, a variable resistance pattern 130a and a second electrode 132a may be formed on a substrate 100. Each of the first structures 120 may include a switching pattern 106b and a first electrode 108b sequentially stacked. A second conductive line 136 may be formed on the second electrode 132a.

The first insulation pattern 126a may fill a space between the first structures in the second direction, and the second insulation pattern 126b may fill a space between the first structures in the first direction. The first insulation pattern 126a may have a pillar shape, and a plurality of first insulation patterns 126a may be spaced apart from each other. The second insulation pattern 126b may extend in the second direction.

The variable resistance pattern 130a may be formed on the first electrode 108b, and may fill a first opening defined by the first and second insulation patterns 126a and 126b. In example embodiments, the variable resistance pattern 130a may contact an entire top surface of the first electrode 108b. Sidewalls of the variable resistance pattern 130a may directly contact sidewalls of the first and second insulation patterns 126a and 126b.

The second electrode 132a may be formed on the variable resistance pattern 130a. The second electrode 132a may fill the second opening defined by the second insulation patterns 126b over the variable resistance pattern 130a. In example embodiments, sidewalls of the second electrode 132a may directly contact the sidewall of the second insulation pattern 126b.

Figure 18:
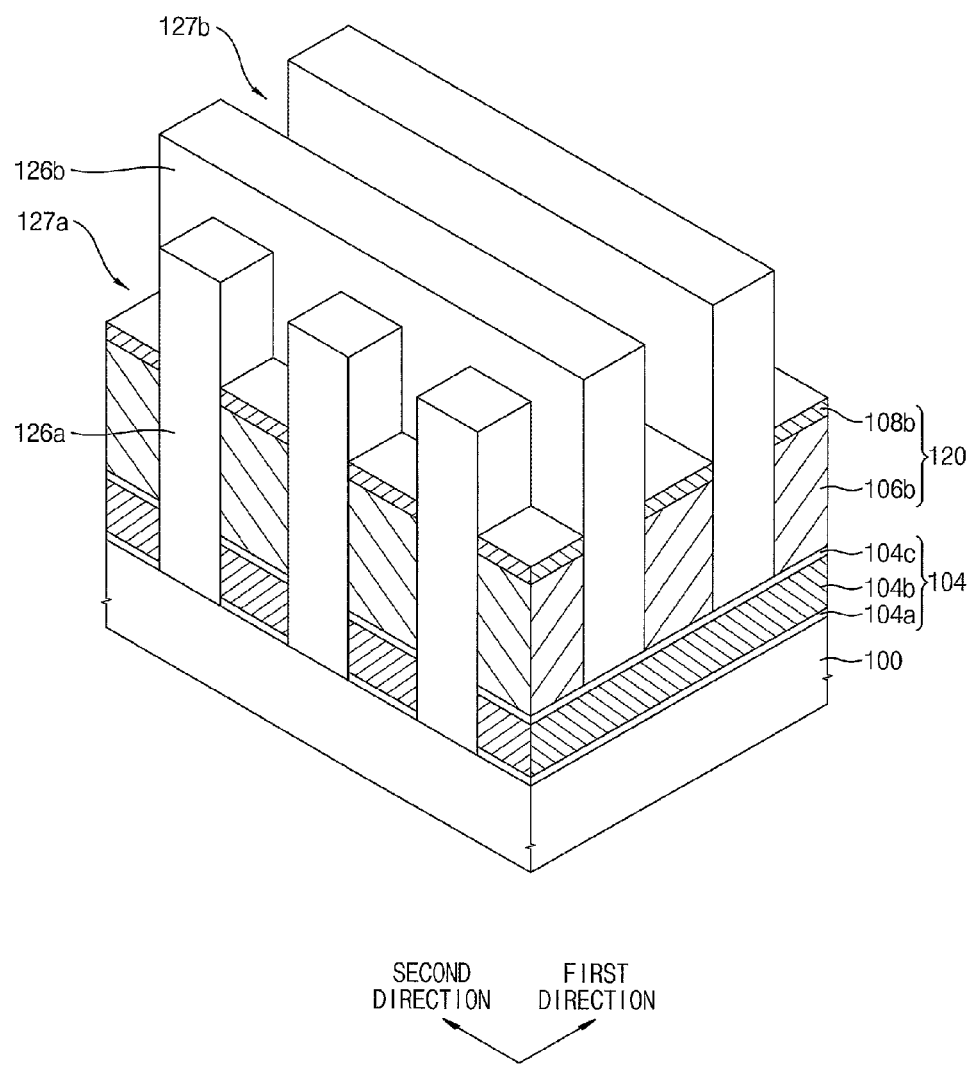
FIG. 18 is a perspective view illustrating stages of a method of manufacturing the semiconductor device in accordance with example embodiments.

FIG. 18 is a perspective view illustrating stages of a method of manufacturing a semiconductor device in accordance with example embodiments.

First, processes substantially the same as or similar to those illustrated with reference to FIGS. 4 to 10 may be performed.

Referring to FIG. 18, the first and second hard masks 112b and 116a may be removed by an isotropic etching process, and the etch stop pattern 110b may be removed by an isotropic etching process or an anisotropic etching processes.

By the etching processes, the first and second insulation patterns 126a and 126b may be formed between the first structures 120, and may protrude above the first structures 120. The first hard mask 112b and the etch stop pattern 110b may be removed to form a first opening 127a. A top surface of the first electrode 108b may be exposed by the first opening 127a. The second hard mask 116a may be removed to form a second opening 127b. The second opening 127b may be formed over the first opening 127a, and may extend in the second direction.

Processes substantially the same as or similar to those illustrated with reference to FIGS. 13 to 14 may be performed, and the second conductive line 136 (refer to FIG. 17) may be formed. That is, the first and second spacers may not be formed. Thus, the semiconductor device of FIG. 17 may be manufactured.

Figure 19:
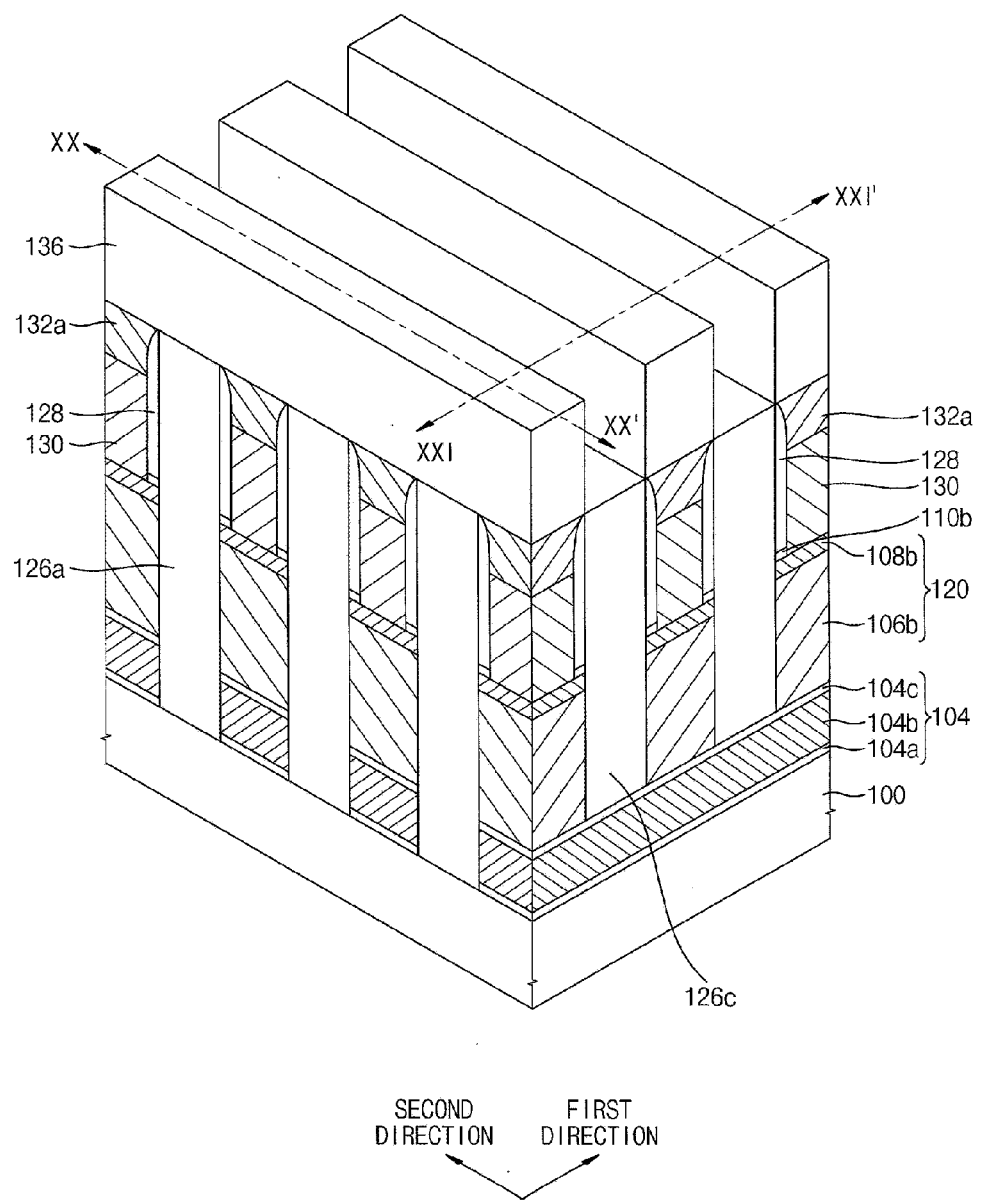
FIGS. 19 to 21 are a perspective view and cross-sectional views illustrating semiconductor devices in accordance with example embodiments.
Figure 20:
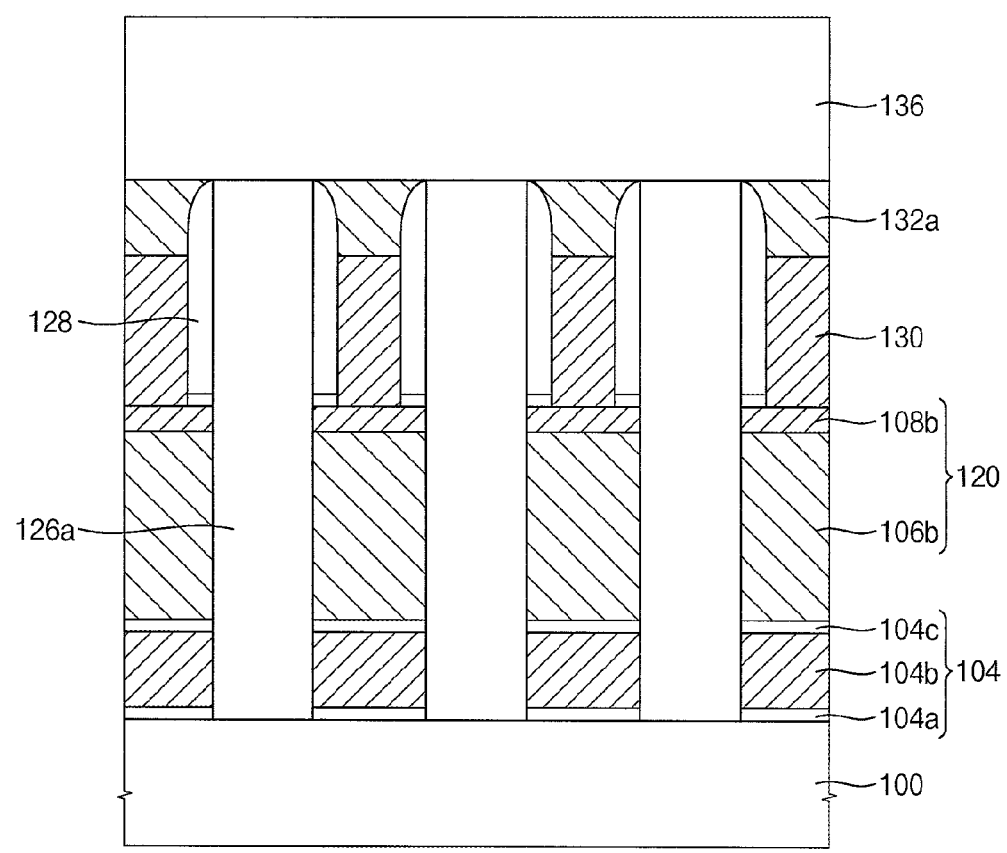
Figure 21:
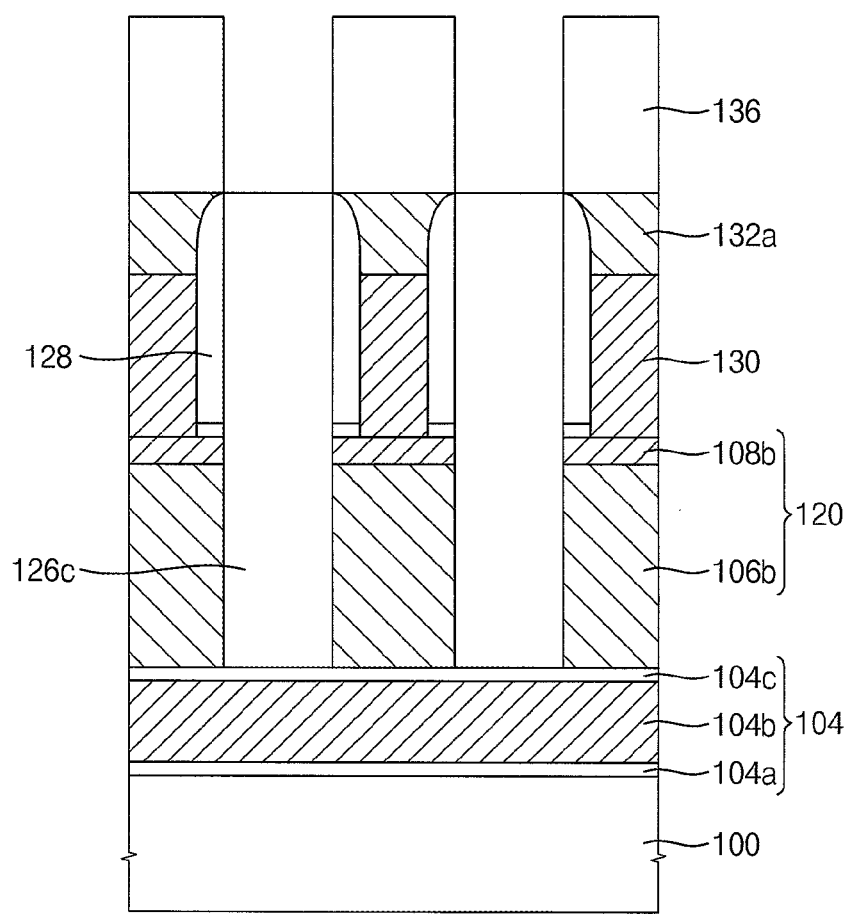

FIG. 19 is a perspective view illustrating a semiconductor device in accordance with example embodiments. FIGS. 20 to 21 are cross-sectional views, taken along lines XX-XX' and XXI-XXI' of FIG. 19. The semiconductor devices may be substantially the same as or similar to those illustrated with reference to FIGS. 1 to 3, except for the shape of the second electrode.

Referring to FIGS. 19 to 21, a first conductive line 104, a plurality of first structures 120, a first insulation pattern 126a, a second insulation pattern 126c, a variable resistance pattern 130 and a second electrode 132a may be formed on the substrate 100. Each of the first structures 120 may include a switching pattern 106b and a first electrode 108b. A second conductive line 136 may be formed on the second electrode 132a.

The first and second insulation patterns 126a and 126c may be formed on the substrate 100, and may fill a space between the first structures 120. The first and second insulation patterns 126a and 126c may protrude above the first structures 120.

The first insulation pattern 126a may fill a space between the first structures 120 in the second direction, and the second insulation pattern 126c may fill a space between the first structures 120 in the first direction. The first insulation pattern 126a may have a pillar shape, and a plurality of first insulation patterns 126a may be spaced apart from each other. The second insulation pattern 126c may extend in the second direction.

Top surfaces of the first and second insulation patterns 126a and 126c may be substantially coplanar with each other. The first and second insulation patterns 126a and 126c, which may be merged into a single structure, may have a shape of a grid. A first opening may be formed over the first electrode 108b, and a plurality of first openings may be isolated from each other.

In example embodiments, spacers 128 may be formed on upper sidewalls of the first and second insulation patterns 126a and 126c. In example embodiments, the spacers 128 may not be formed on the upper sidewalls of the first and second insulation patterns 126a and 126c.

The variable resistance pattern 130 may be formed on the first electrode 108b, and may fill a lower portion of the first opening defined by the first and second insulation patterns 126a and 126c. That is, a top surface of the variable resistance pattern 130 may be lower than the top surfaces of the first and second insulation patterns 126a and 126c.

The second electrode 132a may be formed on the variable resistance pattern 130, and may sufficiently fill the first opening. In example embodiments, a top surface of the second electrode 132a may be substantially coplanar with the top surfaces of the first and second insulation patterns 126a and 126c.

A structure including the variable resistance pattern 130 and the second electrode 132a sequentially stacked may have a pillar shape.

The second conductive line 136 may be formed on the first insulation pattern 126a and the second electrode 132a. A plurality of second electrodes 132a may be arranged in the second direction. The second conductive line 136 may contact the second electrodes 132a arranged in the second direction, and may extend in the second direction.

FIGS. 22 to 26 are perspective views illustrating stages of a method of manufacturing a semiconductor device in accordance with example embodiments.

Figure 22:
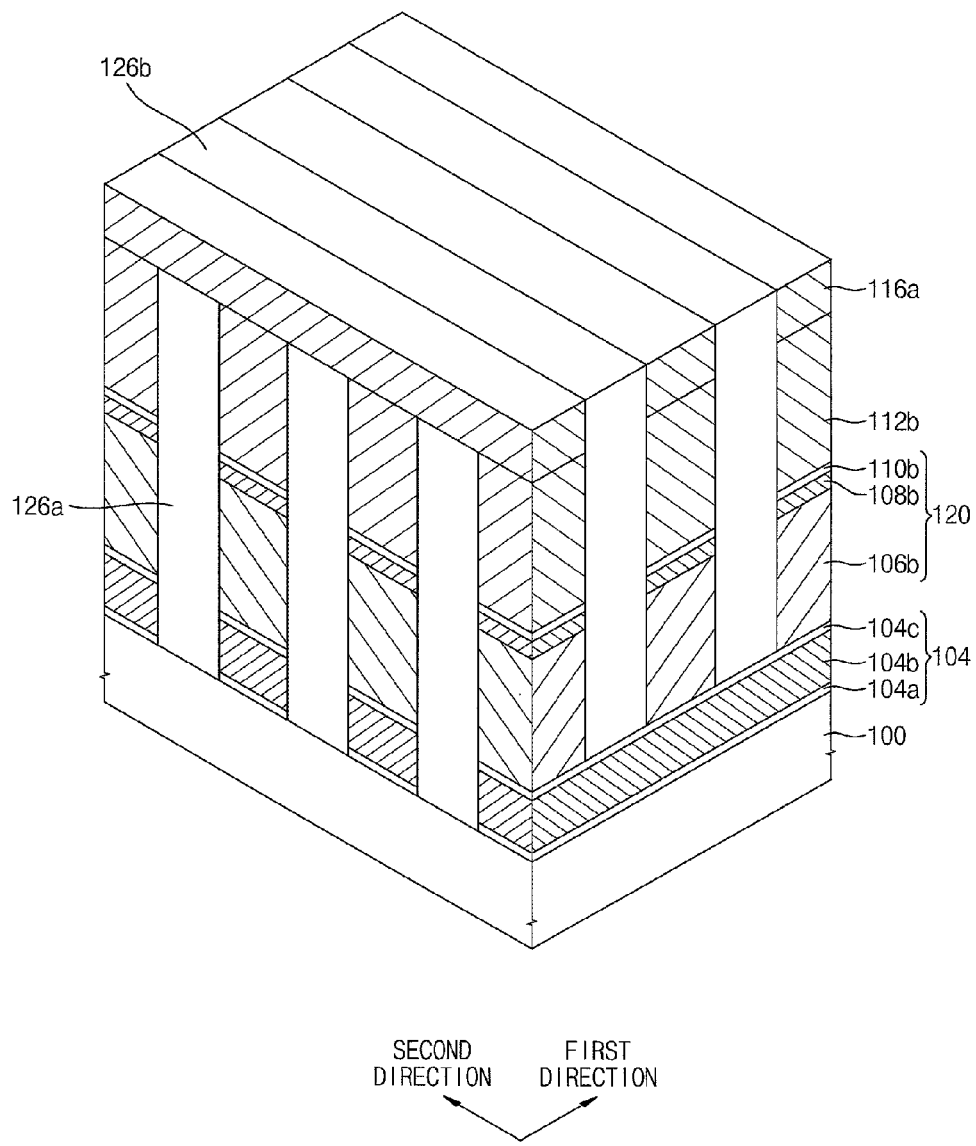
FIGS. 22 to 26 are perspective views illustrating stages of a method of manufacturing the semiconductor device in accordance with example embodiments.

Referring to FIG. 22, first, processes substantially the same as or similar to those illustrated with reference to FIGS. 4 to 10 may be performed. However, a first hard mask layer may be formed to have a thickness greater than a thickness of the first hard mask layer shown in FIG. 4. In example embodiments, the thickness of the first hard mask layer may be greater than the sum of thicknesses of the variable resistance pattern 130 and the second electrode 132. Thus, a height of the first insulation pattern 126a may increase, and a height difference between top surfaces of the first and second insulation patterns 126a and 126c may decrease.

Figure 23:
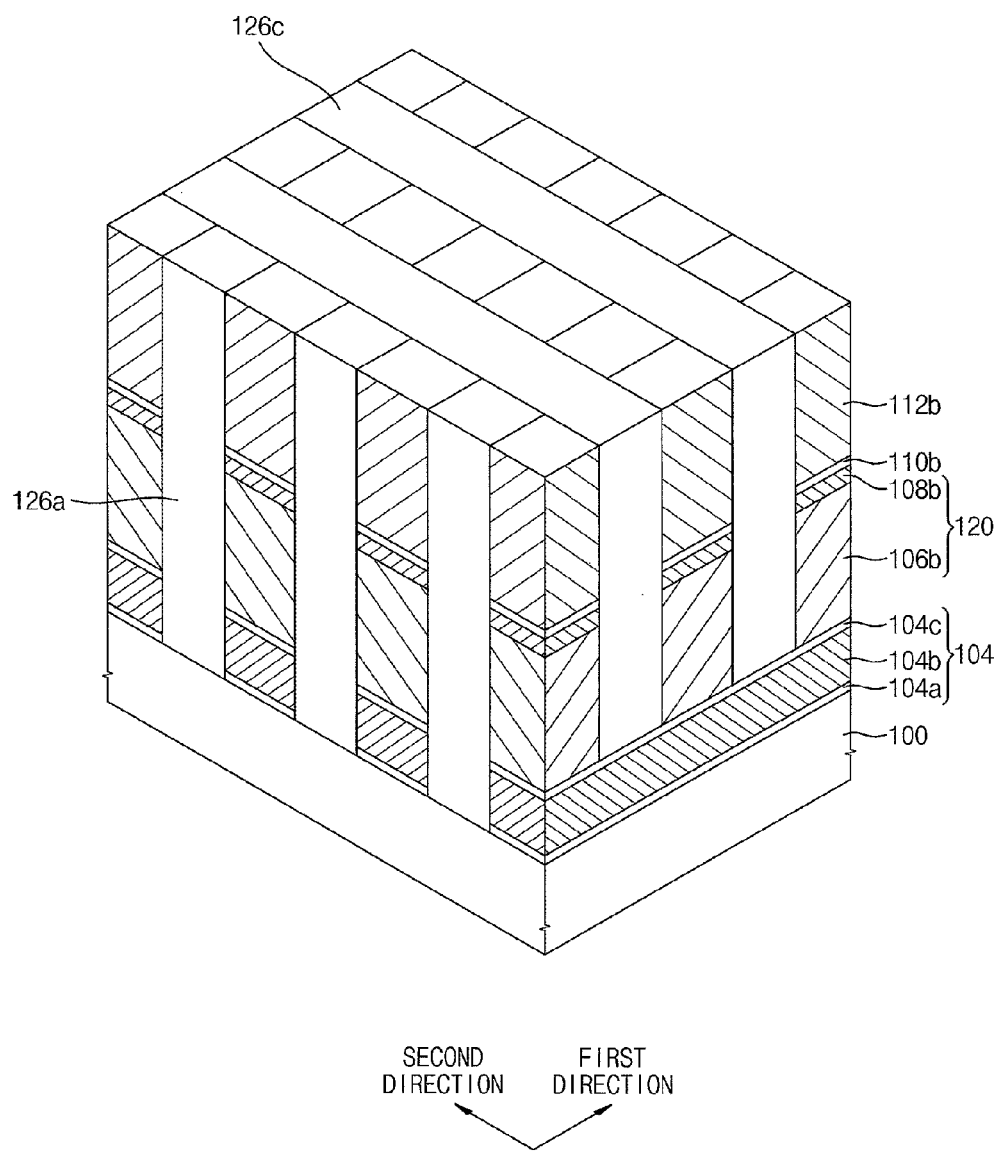

Referring to FIG. 23, upper portions of the second hard mask 116a and the second insulation pattern 126c may be planarized until a top surface of the first hard mask 112b may be exposed. Thus, the second insulation pattern 126c may be partially removed, so that top surfaces of the first and second insulation patterns 126a and 126c may be substantially coplanar with each other. The first and second insulation patterns 126a and 126c may cross each other in the first and second directions, and may have a shape of a grid. The planarization process may be performed by a CMP process and/or an etch back process.

Figure 24:
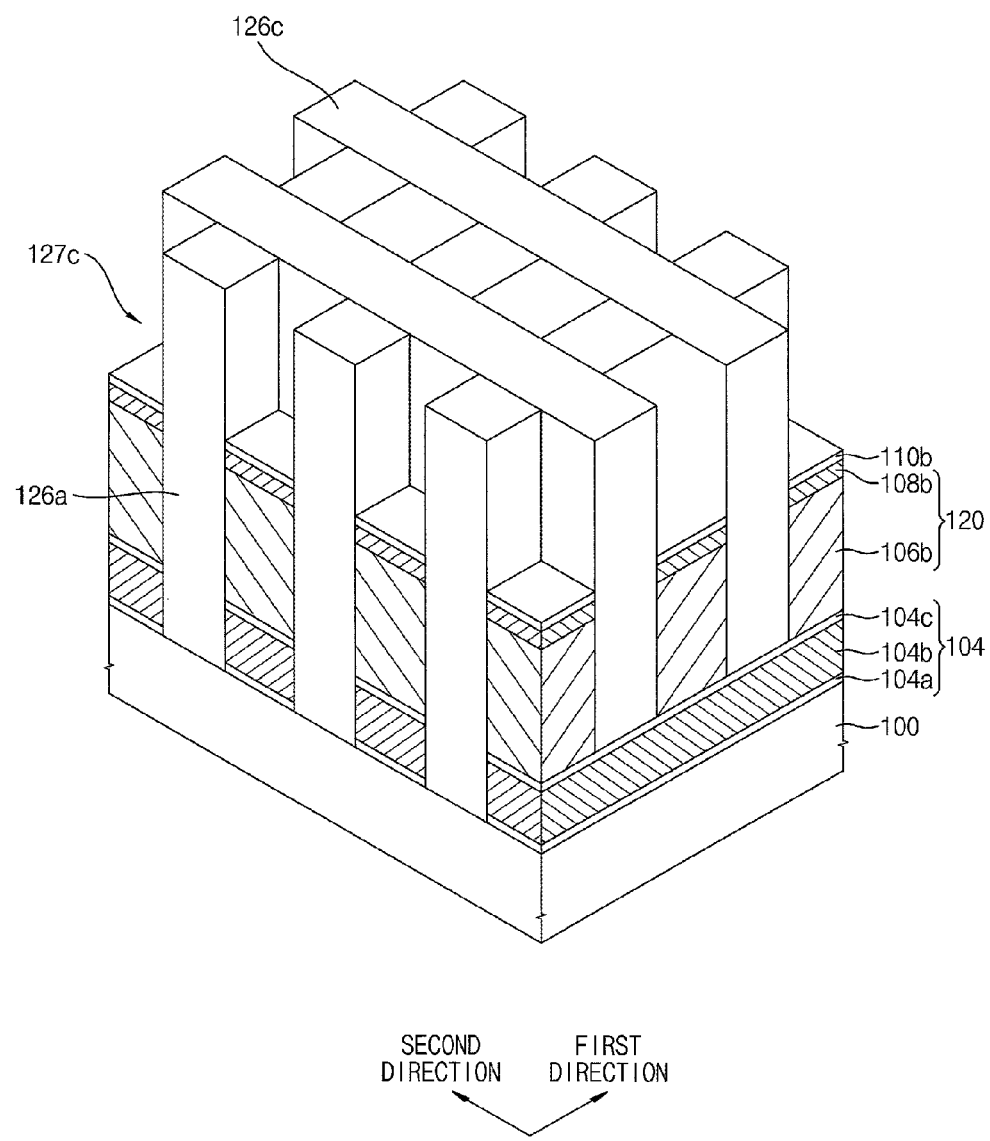

Referring to FIG. 24, the first and second hard masks 112a and 116a may be removed by an isotropic etching process or an anisotropic etching process.

By the etching process, a first opening may be formed over the first structure 120, and may be defined by the first and second insulation patterns 126a and 126c.

Figure 25:
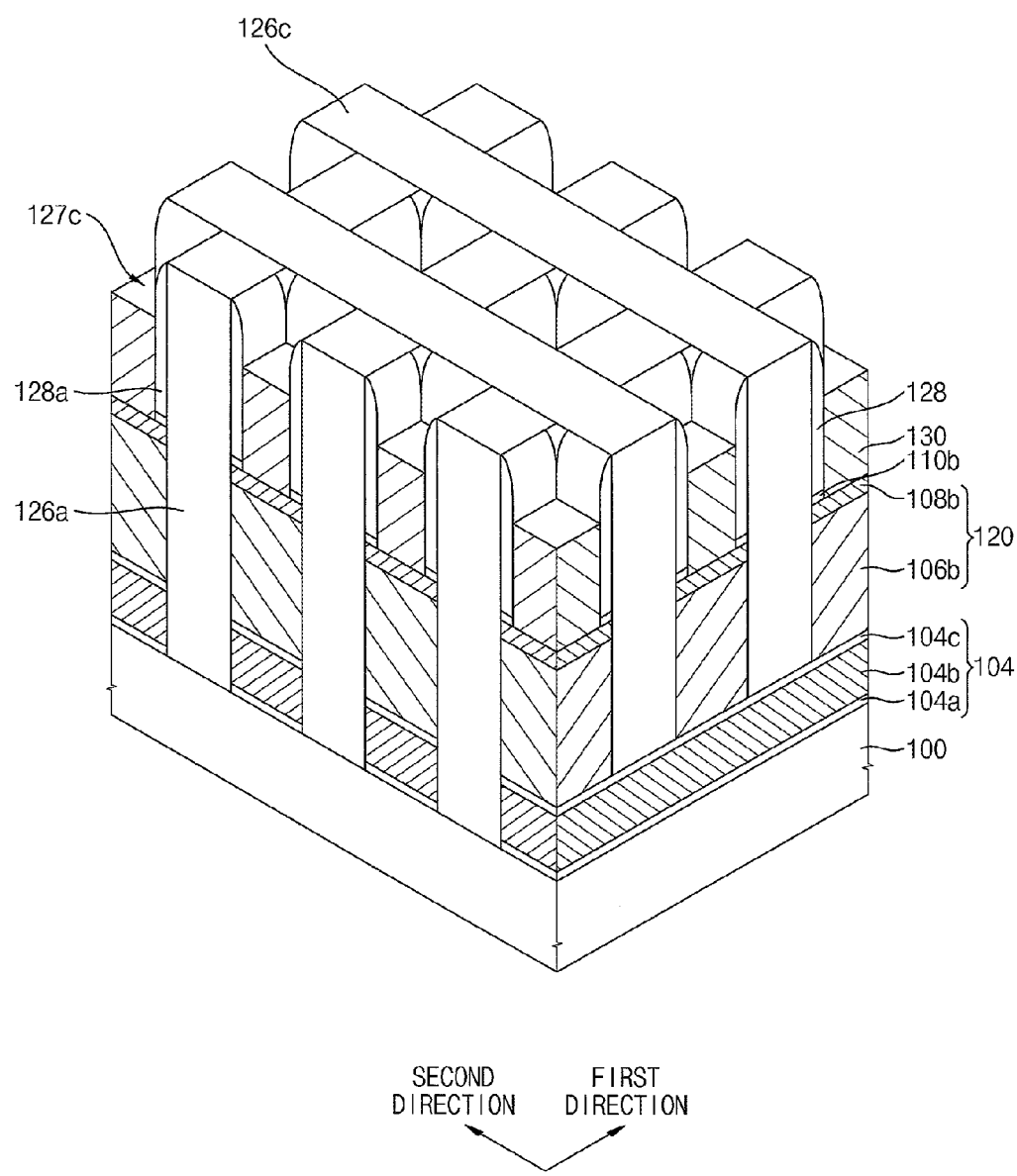

Referring to FIG. 25, a spacer 128 may be formed on a sidewall of the first opening. The etch stop pattern 110b may be etched so that the first electrode 108b may be exposed by the first opening 127c. A variable resistance pattern 130 may be formed on the first electrode 108b to fill a lower portion of the first opening 127c.

Particularly, an insulation spacer layer may be conformally formed on an inner wall of the first opening 127c and the top surfaces of the first and second insulation patterns 126a and 126c. The insulation spacer layer and the etch stop pattern 110b under the insulation spacer layer may be anisotropically etched to form the spacer 128. The spacer 128 may be formed on upper sidewalls of the first and second insulation patterns 126a and 126c above the first structure 120.

A variable resistance layer may be formed to fill the first opening 127c. The variable resistance layer may be etched back to form a variable resistance pattern 130 to fill a lower portion of the first opening 127c. A top surface of the variable resistance pattern 130 may be lower than the surfaces of the first and second insulation patterns 126a and 126c.

Figure 26:
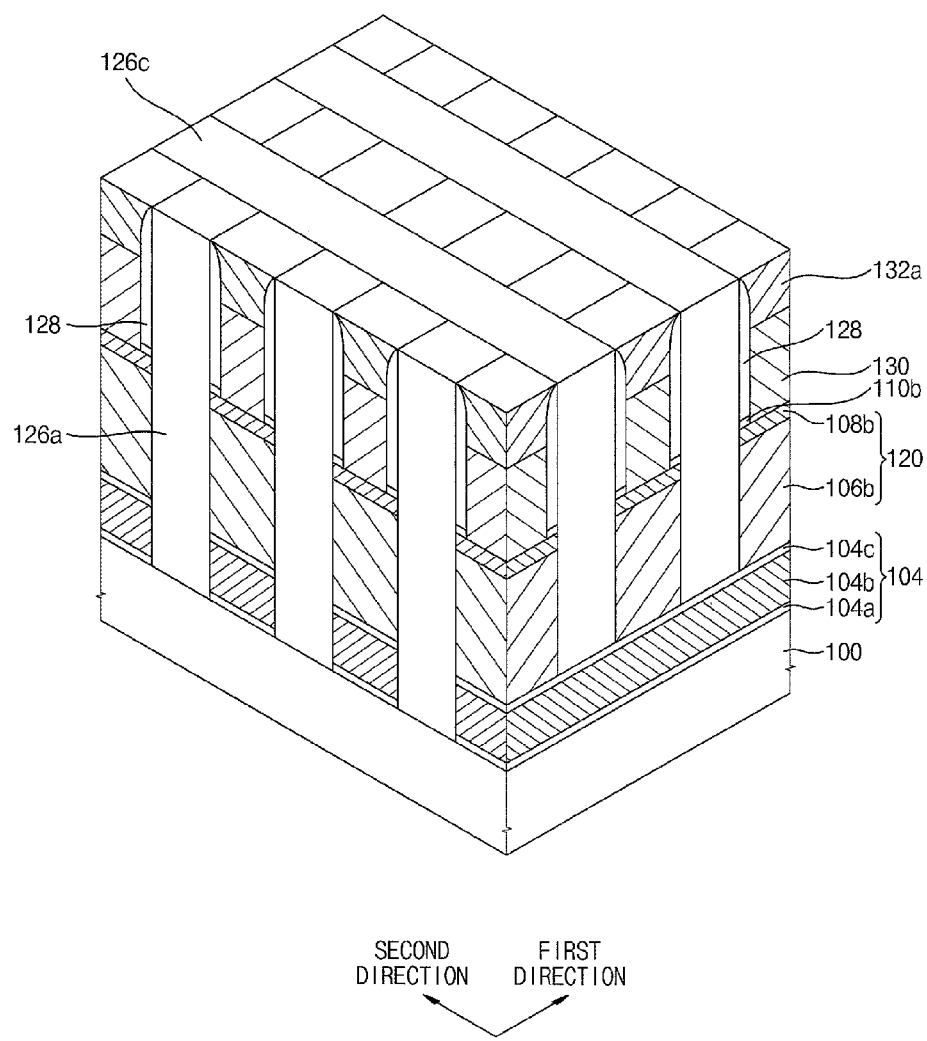

Referring to FIG. 26, a second electrode 132a may be formed on the variable resistance pattern 130 to fill the first opening 127c.

Particularly, a second electrode layer may be formed to fill the first opening 127c. An upper portion of the second electrode layer may be planarized until the top surfaces of the first and second insulation patterns 126a and 126c may be exposed to form the second electrode 132a in the first opening 127c. The planarization process may be performed by a CMP process and/or an etch back process.

A top surface of the second electrode 132a may be substantially coplanar with the top surfaces of the first and second insulation patterns 126a and 126c.

A structure including the variable resistance pattern 130 and the second electrode 132a sequentially stacked may have a pillar shape.

Referring to FIG. 19 again, a second conductive line 136 may be formed on the first insulation pattern 126a and the second electrode 132a, and may extend in the second direction. Particularly, a second conductive layer may be formed on the first insulation pattern 126a and the second electrode 132a, and the second conductive layer may be patterned to form the second conductive line 136.

Figure 27:
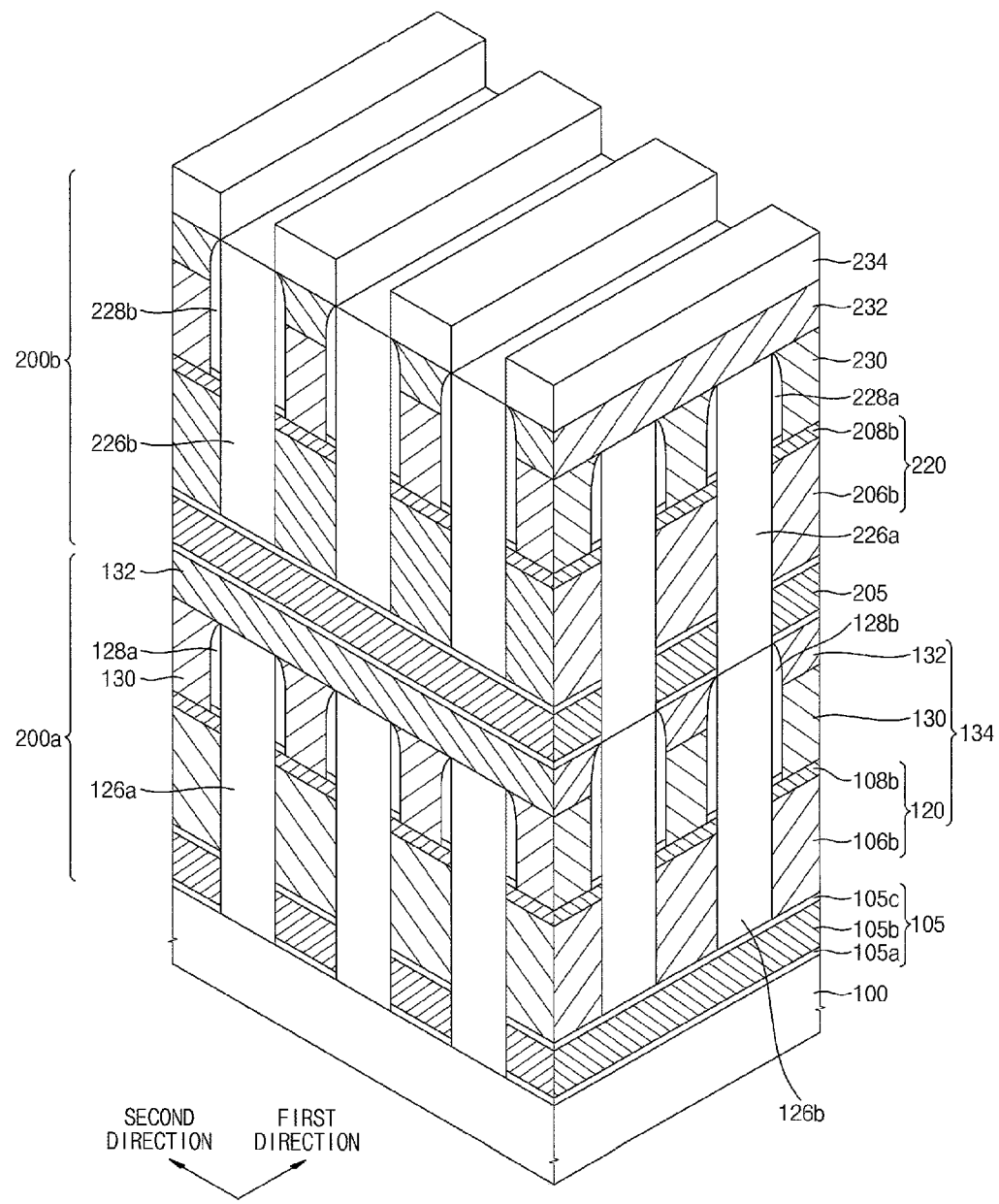
FIG. 27 is a perspective view illustrating a semiconductor device in accordance with example embodiments.

FIG. 27 is a perspective view illustrating a semiconductor device in accordance with example embodiments.

The semiconductor devices may be substantially the same as or similar to those illustrated with reference to FIGS. 1 to 3, except that the semiconductor device includes memory cells stacked at a plurality of levels.

Referring to FIG. 27, a lower structure 200a including a lower memory cell and an upper structure 200b including an upper memory cell may be sequentially stacked on a substrate 100.

The lower structure 200a may include a first conductive line 105, a first structure 120, a first insulation pattern 126a, a second insulation pattern 126b, a first variable resistance pattern 130 and a second electrode 132. The first structure 120 may include a first switching pattern 106b and a first electrode 108b.

The first conductive line 105 may extend in the first direction. In example embodiments, the first conductive line 105 may serve as a first bit line. The first structure 120, the first and second insulation patterns 126a and 126b, the first variable resistance pattern 130 and the second electrode 132 on the first conductive line 105 may serve as the lower memory cell. The lower memory cell may be substantially the same as the memory cell illustrated with reference to FIGS. 1 to 3.

The upper structure 200b may be formed on the second electrode 132 and the second insulation pattern 126b.

The upper structure 200b may include a second conductive line 205, a second structure 220, a third insulation pattern 226a, a fourth insulation pattern 226b, a second variable resistance pattern 230 and a fourth electrode 232. The second structure 220 may include a second switching pattern 206b and a third electrode 208b.

The second conductive line 205 may extend in the second direction. The third conductive line 234 may extend in the first direction. In example embodiments, the second conductive line 205 may serve as a common word line of the lower and upper memory cells. The third conductive line 234 may serve as a bit line of the upper memory cell.

The second structure 220, the third and fourth insulation patterns 226a and 226b, the second variable resistance pattern 230 and the fourth electrode 232 may serve as the upper memory cell. The upper memory cell may be substantially the same as the memory cell illustrated with reference to FIGS. 1 to 3. However, the second conductive line 205 and the first conductive line 105 may extend in directions substantially perpendicular with each other.

Thus, the lower memory cell 134 may be formed at a cross point of the first and second conductive lines 105 and 205, and the upper memory cell may be formed at a cross point of the second and third conductive lines 205 and 234.

The first electrode 108b, the first variable resistance pattern 130 and the second electrode 132 of the lower structure 200a may be self-aligned, and the third electrode 208b, second variable resistance pattern 230 and the fourth electrode 232 of the upper structure 200b may be self-aligned. Thus, failures of the semiconductor device due to the mis-alignment may be decrease.

In FIG. 27, the semiconductor device has memory cells stacked at two levels, respectively. However, inventive concepts may not be limited thereto, and the semiconductor device may have memory cells stacked at more than two levels, respectively.

In some example embodiments, the second conductive line 205 and the second electrode 132 may be combined to form a common electrode structure. Alternatively, the second conductive line 205 may be omitted, and the structure 220 may be formed directly on the second electrode.

The semiconductor device of FIG. 27 may be formed by repeatedly performing processes substantially the same as or similar to those illustrated with reference to FIGS. 4 to 14. That is, the first structure 120, the first and second insulation patterns 126a and 126b, the first variable resistance pattern 130 and the second electrode 132 may be formed on the first conductive line 105. The first structure 120 may include the first switching pattern 106b and the first electrode 108b.

A second conductive layer, a second switching layer, a third electrode layer, a second etch stop layer and a third hard mask layer may be sequentially formed on the second insulation pattern 126b and the second electrode 132.

The processes substantially the same as or similar to those illustrated with reference to FIGS. 5 to 14 may be performed again. However, a third hard mask may extend in a direction different from the direction of the first hard mask, and a fourth hard mask may extend in a direction different from the direction of the second hard mask. Particularly, the third hard mask may extend in the second direction, and the fourth hard mask may extend in the first direction. The upper structure 200b may include first spacers 228a and second spacers 228b. The first spacers 228a and second spacers 228b of the upper structure 200b may be formed of the same materials as the first spacers 128a and the second spacers 128b in the lower structure 200a. Alternatively, the first spacers 228a and second spacers 228b of the upper structure 200b may be formed of different materials than the first spacers 128a and the second spacers 128b in the lower structure 200a.

Thus, the second conductive line 205 may be formed on the second insulation pattern 126b and the second electrode 132, and may extend in the second direction. The upper memory cell may be formed on the second conductive line 205, and may include the second switching pattern 206b, the third electrode 208b, the third and fourth insulation patterns 226a and 226b, the second variable resistance pattern 230 and the fourth electrode 232.

A third conductive layer may be formed on the fourth electrode 232 and the fourth insulation pattern 226b, and the third conductive layer may be patterned to form the third conductive line 234 extending in the first direction.

As described above, the semiconductor device including stacked memory cells at a plurality of levels may be manufactured. Also, failures of the semiconductor device due to the mis-alignment may decrease.

Figure 28:
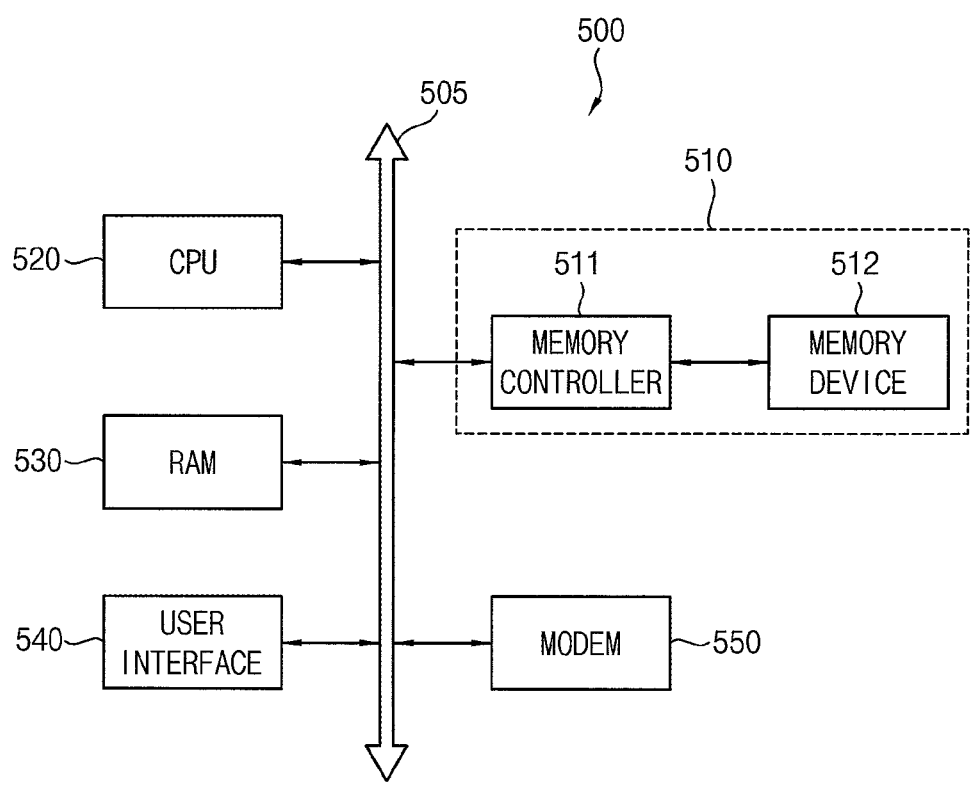
FIG. 28 is a block diagram illustrating a schematic construction of an information processing system in accordance with example embodiments.

FIG. 28 is a block diagram illustrating a schematic construction of an information processing system in accordance with example embodiments.

Referring to FIG. 28, an information processing system 500 may include a CPU 520, a RAM 530, a user interface 540, a modem 550, e.g., a baseband chipset, and at least one memory system 510, which may be electrically connected to a system bus 505. The memory system 510 may include a memory device 512 and a memory controller 511. The memory device 512 may include one of the above-described variable resistance memory devices in accordance with example embodiments. Thus, large data processed by the CPU 520 or input from an external device may be stored in the memory device 512 with high stability. The memory controller 511 may have a construction capable of controlling the memory device 512. The memory system 510 may serve as, e.g., a memory card or a solid state disk (SSD) by a combination of the memory device 512 and the memory controller 511. When the information processing system 500 is a mobile device, a battery may be further provided for supplying a driving voltage of the information processing system 500. The information processing system 500 may further include an application chipset, a camera image processor (CIS), a mobile DRAM, etc. The information processing system 500 may be used for mobile phones, MP3 players, and various appliances.

The foregoing is illustrative of example embodiments and is not to be construed as limiting thereof. Although a few example embodiments have been described, those skilled in the art will readily appreciate that many modifications are possible in the example embodiments without materially departing from the novel teachings and features of example embodiments of inventive concepts. Descriptions of features or aspects within each device or method according to example embodiments should typically be considered as available for other similar features or aspects in other devices or methods according to example embodiments. Accordingly, all such modifications are intended to be included within the scope of example embodiments of inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
    a substrate;
    a plurality of first conductive lines on the substrate, the first conductive lines extending in a first direction;
    a plurality of first structures on the first conductive lines, the first structures being spaced apart from each other, the first structures including a switching pattern and a first electrode sequentially stacked, and top surfaces of the switching pattern and the first electrode being substantially coplanar with each other;
    a first insulation pattern on the substrate, the first insulation pattern extending in the first direction between the first structures to fill a space between the first structures in a second direction that is substantially perpendicular to the first direction, and the first insulation pattern having a first top surface that is higher than a top surface of the first structures;
    a second insulation pattern on the substrate, the second insulation pattern extending in the second direction between the first structures to fill a space between the first structures in the first direction, and the second insulation pattern having a second top surface that is higher than a top surface of each of the first structures;
    a variable resistance pattern on the first structures, the variable resistance pattern filling an opening defined by the first and second insulation patterns; and
    a second electrode on the variable resistance pattern.

2. The semiconductor device of claim 1, further comprising:
    a first spacer on upper sidewalls of the first insulation pattern above the first structures; and a second spacer on upper sidewalls of the second insulation pattern above the first structures.

3. The semiconductor device of claim 2, wherein a bottom surface of the variable resistance pattern is smaller than an area of the top surface of the first structures.

4. The semiconductor device of claim 1, wherein a top surface of the variable resistance pattern is substantially coplanar with the first top surface of the first insulation pattern.

5. The semiconductor device of claim 1, wherein the second electrode extends in the second direction.

6. The semiconductor device of claim 1, wherein
    the second top surface is higher than the first top surface, and
    the second electrode is between protruding portions of the second insulation pattern above the first insulation pattern.

7. The semiconductor device of claim 1, further comprising:
    a second conductive pattern on the second electrode, wherein
    the second conductive pattern has a resistance lower than a resistance of the second electrode, and
    the second conductive pattern extends in the second direction.

8. The semiconductor device of claim 1, wherein the variable resistance pattern includes a chalcogenide-based material.

9. The semiconductor device of claim 1, wherein the second electrode has a pillar shape.

10. The semiconductor device of claim 1, wherein
    the first and second top surfaces are substantially coplanar with each other, and
    the second electrode is on the variable resistance pattern in the opening defined the first and second insulation patterns.

11. The semiconductor device of claim 1, wherein an upper width in the second direction of the first conductive lines is substantially the same as a lower width in the second direction of the first structure.

12. A semiconductor device, comprising:
    a substrate;
    a plurality of first conductive lines on the substrate, the first conductive lines extending in a first direction;
    a plurality of first structures on the first conductive lines, the first structures being spaced apart from each other, the first structures including a switching pattern and a first electrode sequentially stacked, and top surfaces of the switching pattern and the first electrode being substantially coplanar with each other;
    a first insulation pattern on the substrate, the first insulation pattern extending in the first direction to fill a space between the first structures in a second direction that is substantially perpendicular to the first direction, and a first top surface of the first insulation pattern being higher than a top surface of the first structures;
    a second insulation pattern on the substrate, the second insulation pattern extending in the second direction, the second insulation pattern to fill a space between the first structures in the first direction, and the second insulation pattern having a second top surface that is higher than a top surface of the first structures;
    a first spacer on upper sidewalls of the first insulation pattern above the first structures;
    a second spacer on upper sidewalls of the second insulation pattern above the first structures;
    a variable resistance pattern on the first structures, the variable resistance pattern filling an opening defined by the first and second insulation patterns; and
    a second electrode on the variable resistance pattern.

13. The semiconductor device of claim 12, wherein the second electrode extends in the second direction.

14. The semiconductor device of claim 12, wherein the second electrode has a pillar shape.

15. The semiconductor device of claim 12, wherein the variable resistance pattern includes a chalcogenide-based material.

16. A semiconductor device, comprising:
    a substrate;
    first conductive lines on the substrate, the first conductive lines extending in a first direction and being spaced apart from each other in a second direction that intersects the first direction;
    first structures on the first conductive lines, the first structures being spaced apart from each other in the first direction on the first conductive lines;
    a variable resistance pattern on the first structures, the variable resistance pattern including variable resistance structures on the first structures, respectively;
    electrodes on the substrate over the variable resistance pattern, the electrodes being spaced apart from each other in the first direction and extending in the second direction, the electrodes crossing over the first conductive lines;

a first insulation pattern on the substrate, the first insulation pattern extending between a bottom surface of the electrodes and a portion of the substrate exposed by the first conductive lines; and a second insulation pattern on the first conductive lines, the second insulation pattern extending in the second direction, the second insulation pattern extending between adjacent pairs of the first structures, between adjacent pairs of the variable resistance structures, and between adjacent pairs of the electrodes.

17. The semiconductor device of claim 16, further comprising:

first spacers on the first structures; and second spacers on the first structures, wherein the first structures include a first electrode on a switching structure, the electrodes on the substrate over the variable resistance pattern are second electrodes, there are two of the first spacers spaced apart from each other in the second direction on each of the first structures, there are two of the second spacers spaced apart from each other in the first direction on each of the first structures, the variable resistance structures on the first structures are between the two of the first spacers and the two of the second spacers, and a height of the second spacers is greater than a height of the first spacers.

18. The semiconductor device of claim 16, wherein an area of a bottom of the variable resistance structures is less than an area of a top of the variable resistance structures.

19. The semiconductor device of claim 16, wherein the first insulation pattern extends between adjacent pairs of the first conductive lines, and a bottom surface of the first insulation pattern is closer to the substrate than a bottom surface of the second insulation pattern.

20. The semiconductor device of claim 16, wherein a top surface of the second insulation pattern is level with a top surface of the electrodes.

* * * * *